United States Patent
Lin et al.

(10) Patent No.: US 11,463,052 B2
(45) Date of Patent: Oct. 4, 2022

(54) PWM DRIVING CIRCUIT AND METHOD

(71) Applicants: STMicroelectronics S.r.l., Agrate Brianza (IT); STMicroelectronics (Shenzhen) R&D Co. Ltd., Shenzhen (CN)

(72) Inventors: Hong Wu Lin, Shenzhen (CN); Giovanni Gonano, Padua (IT); Edoardo Botti, Vigevano (IT)

(73) Assignees: STMicroelectronics S.r.l., Agrate Brianza (IT); STMicroelectronics (Shenzhen) R&D Co. Ltd., Shenzhen (CN)

( * ) Notice: Subject to any disclaimer, the term of this patent is extended or adjusted under 35 U.S.C. 154(b) by 134 days.

(21) Appl. No.: 17/107,269

(22) Filed: Nov. 30, 2020

(65) Prior Publication Data
US 2022/0173706 A1    Jun. 2, 2022

(51) Int. Cl.
H03F 3/217      (2006.01)
H03K 17/687    (2006.01)
H03K 19/20     (2006.01)
H04R 3/00      (2006.01)

(52) U.S. Cl.
CPC ......... *H03F 3/217* (2013.01); *H03K 17/6871* (2013.01); *H04R 3/00* (2013.01); *H03K 19/20* (2013.01)

(58) Field of Classification Search
CPC .... H03F 3/217; H03K 17/6871; H03K 19/20; H04R 3/00
See application file for complete search history.

(56) References Cited

U.S. PATENT DOCUMENTS

| | | |
|---|---|---|
| 5,023,566 A | 6/1991 | El-Hamamsy et al. |
| 6,307,431 B1 | 10/2001 | Botti et al. |
| 6,577,186 B2 | 6/2003 | Berkhout |
| 6,897,640 B2 | 5/2005 | Nebon et al. |
| 7,142,050 B2 | 11/2006 | Risbo |
| 7,315,202 B2 | 1/2008 | Tsuji |
| 7,463,089 B1 | 12/2008 | Bapat et al. |
| 7,541,869 B2 | 6/2009 | Adduci et al. |

(Continued)

FOREIGN PATENT DOCUMENTS

| | | | |
|---|---|---|---|
| CN | 105871361 A | * 8/2016 | ............... H03K 7/08 |
| EP | 1213822 A1 | 6/2002 | |
| EP | 2048896 A1 | 4/2009 | |

OTHER PUBLICATIONS

Chadha, Jasjot, "Post Filter Feedback Class-D Amplifier Benefits and Design Considerations", Texas Instruments, Application Report, SLOA260, Nov. 2017, 6 pages.

(Continued)

*Primary Examiner* — David L Ton
(74) *Attorney, Agent, or Firm* — Slater Matsil, LLP

(57) ABSTRACT

In an embodiment, a method for shaping a PWM signal includes: receiving an input PWM signal; generating an output PWM signal based on the input PWM signal by: when the input PWM signal transitions with a first edge of the input PWM signal, transitioning the output PWM signal with a first edge of the output PWM signal; and when the input PWM signal transitions with a second edge before the first edge of the output PWM signal transitions, delaying a second edge of the output PWM signal based on the first edge of the output PWM signal.

20 Claims, 21 Drawing Sheets

(56) References Cited

U.S. PATENT DOCUMENTS

| | | |
|---|---|---|
| 7,733,170 B2 | 6/2010 | Cheng |
| 7,795,970 B2 | 9/2010 | Kaya et al. |
| 7,948,313 B2 | 5/2011 | Tsuji et al. |
| 7,965,141 B2 | 6/2011 | Dooper et al. |
| 8,212,612 B2 | 7/2012 | Song et al. |
| 8,502,602 B2 | 8/2013 | Hirano et al. |
| 8,866,544 B2 | 10/2014 | Llewellyn |
| 8,917,143 B2 | 12/2014 | Holzmann et al. |
| 9,231,535 B2 | 1/2016 | Du et al. |
| 9,276,530 B1 * | 3/2016 | Liu ................ H03F 3/2173 |
| 9,306,523 B2 | 4/2016 | Du et al. |
| 9,564,862 B2 | 2/2017 | Hoyerby |
| 9,929,706 B2 | 3/2018 | Raimondi et al. |
| 10,461,714 B2 | 10/2019 | Lesso et al. |
| 10,560,082 B2 | 2/2020 | Botti et al. |
| 2006/0008095 A1 | 1/2006 | Tsuji |
| 2007/0229159 A1 | 10/2007 | Krishnan et al. |
| 2008/0272842 A1 | 11/2008 | Lee et al. |
| 2009/0015327 A1 * | 1/2009 | Wu ................ H03F 3/2173 330/251 |
| 2011/0169569 A1 | 7/2011 | Liu |
| 2013/0033319 A1 | 2/2013 | Chen et al. |
| 2015/0155839 A1 | 6/2015 | Buono et al. |
| 2020/0169234 A1 | 5/2020 | Li et al. |
| 2020/0280287 A1 | 9/2020 | Gallo et al. |
| 2020/0295723 A1 | 9/2020 | Du et al. |

OTHER PUBLICATIONS

Gaalaas, Eric, "Class D Audio Amplifiers: What, Why, and How", http://www.analog.com/analogdialogue, Jun. 2006, 7 pages.

Lu, Jingxue et al., "A Self Oscillating Class-D Audio Amplifier with 0.0012% THD+N and 116.5 dB Dynamic Range", University of Texas, IEEE Custom Integrated Circuits Conference, Sep. 19-22, 2010, 4 pages.

Samala, Sreekiran et al., "45nm CMOS 8O Class-D Audio Driver with 79% Efficiency and 100dB SNR", ISSCC Session 4, Analog Techniques 4.7, India, Feb. 7-11, 2010, 4 pages.

* cited by examiner

PRIOR ART

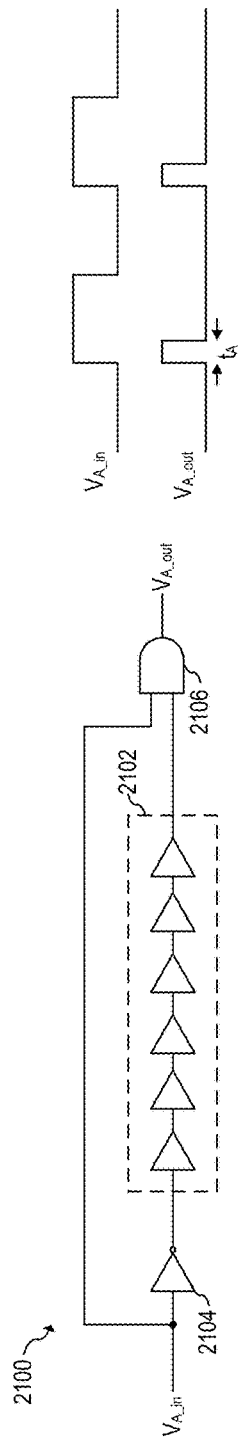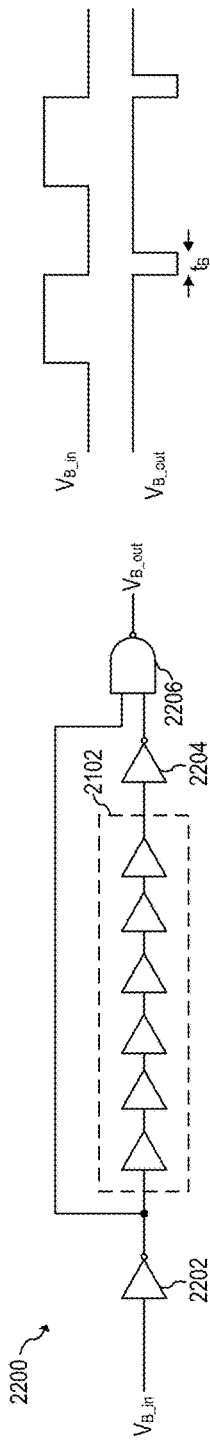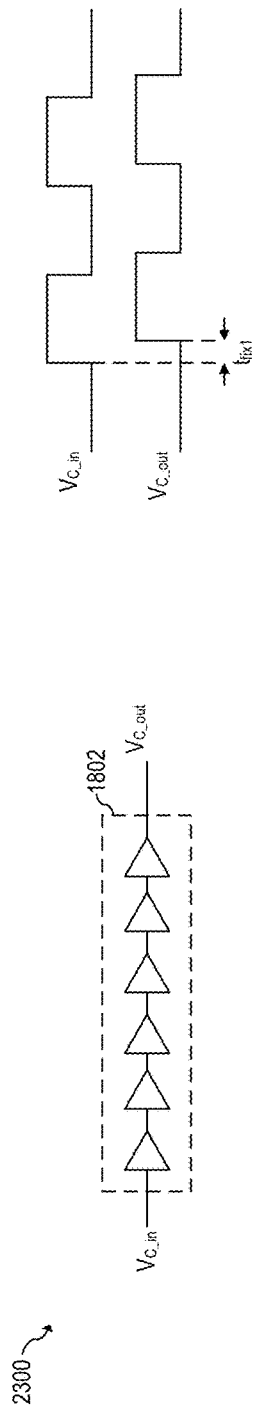

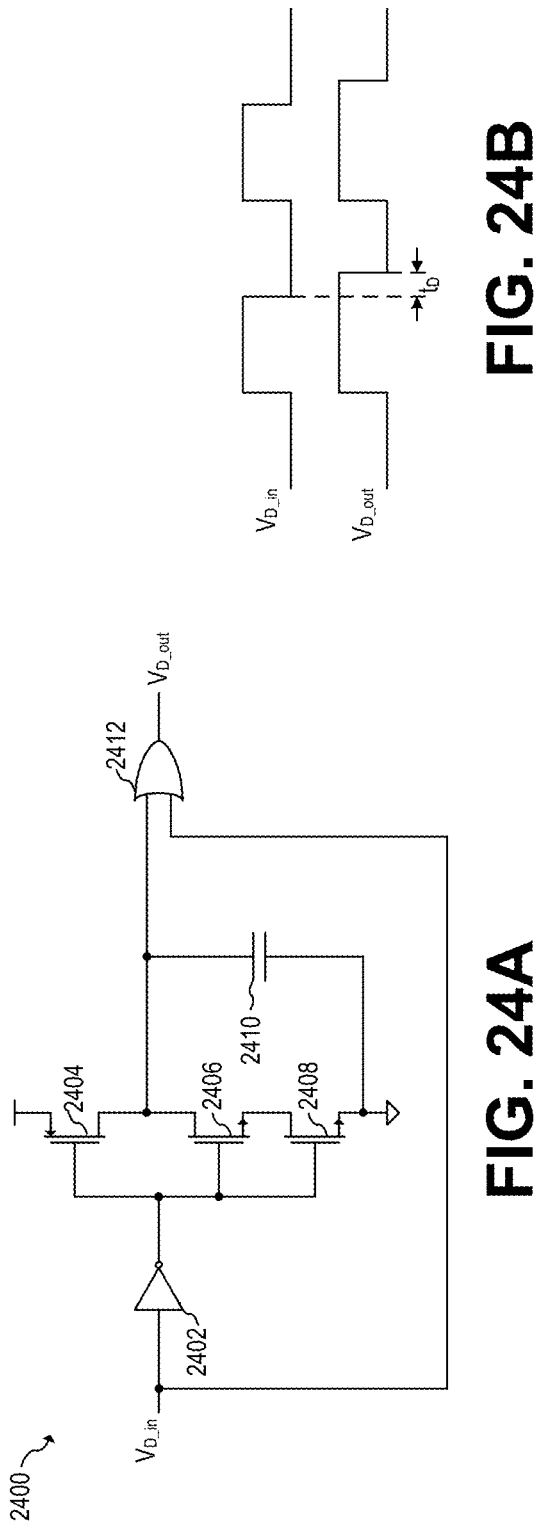

PWM DRIVING CIRCUIT AND METHOD

TECHNICAL FIELD

The present disclosure relates generally to an electronic system and method, and, in particular embodiments, to a pulse-width modulation (PWM) driving circuit and method.

BACKGROUND

A class-D amplifier is a switching amplifier that operates the output transistors as electronic switches instead of in the linear region. FIG. 1 shows a schematic diagram of conventional class-D amplifier 100 for driving audio speaker 114. Class-D amplifier 100 includes comparator 102, drive circuit 104, output stage 105, inductor no, and capacitor 112.

During normal operation, comparator 102 receives audio input signal 116 and triangular waveform 118 (e.g., a sawtooth waveform) and generates pulse-width modulation (PWM) signal 120. PWM signal 120 is used to control drive circuit 104, which in turn drives transistors 106 and 108 of output stage 105 based on PWM signal 120. Output stage 105 produces output signal 122, which drives speaker 114 through low pass filter (LPF) 109 (also referred to as demodulation filter).

PWM signal 120 includes both the original audible signal amplified and high-frequency switching components above the human's audible range (e.g., above 20 kHz), which can be filtered out by LPF 109. In some application, e.g., where EMI are not stringent, LPF 109 can be removed since the impedance of speaker 114 acts as a low-pass filter itself.

FIG. 2 shows a schematic diagram of another conventional class-D amplifier 200 for driving audio speaker 114. Class-D amplifier 200 operates in a similar manner as class-D amplifier loft Class-D amplifier 200, however, includes integrator 202 coupled to comparator for driving comparator 102 based on audio input signal 116 and feedback resistor 210 coupled between the output of output stage 105 and integrator 202.

During normal operation, the square-wave output of output stage 105 is summed with audio input signal 116 to provide negative feedback. Integrator circuit 202 provides the resulting signal into comparator 102, which operates in a similar manner as in class-D amplifier 100.

SUMMARY

In accordance with an embodiment, a method for shaping a pulse-width modulation (PWM) signal includes: receiving an input PWM signal; generating an output PWM signal based on the input PWM signal by: when the input PWM signal transitions with a first edge of the input PWM signal, transitioning the output PWM signal with a first edge of the output PWM signal; and when the input PWM signal transitions with a second edge before the first edge of the output PWM signal transitions, delaying a second edge of the output PWM signal based on the first edge of the output PWM signal, where the second edge of the input PWM signal is a next edge of the input PWM signal after the first edge of the input PWM signal, and where the second edge of the output PWM signal is a next edge of the output PWM signal after the first edge of the output PWM signal.

In accordance with an embodiment, a method for shaping a pulse-width modulation (PWM) signal includes: receiving an input PWM signal; generating an output PWM signal based on the input PWM signal with a high-side transistor driven based on a high-side intermediate signal, and a low-side transistor driven based on a low-side intermediate signal; when the input PWM signal transitions with a first edge of the input PWM signal, driving the high-side and low-side intermediate signals to cause transitioning the output PWM signal with a first edge of the output PWM signal; and when the input PWM signal transitions with a second edge after the first edge of the output PWM signal transitions, transitioning the high-side and low-side intermediate signals based on the first edge of the output PWM signal to cause a second edge of the output PWM signal, where the second edge of the input PWM signal is a next edge of the input PWM signal after the first edge of the input PWM signal, and where the second edge of the output PWM signal is a next edge of the output PWM signal after the first edge of the output PWM signal.

In accordance with an embodiment, a pulse-width modulation (PWM) pre-conditioning circuit includes: a PWM input configured to receive an input PWM signal; high-side and low-side outputs configured to be coupled to control terminals of high-side and low-side transistors, respectively; a switching detection input configured to be coupled to the high-side and low-side transistors to monitor an output PWM signal; and a controller configured to: when the input PWM signal transitions with a first edge of the input PWM signal, drive the high-side and low-side outputs to cause a transition of the output PWM signal with a first edge of the output PWM signal, and when the input PWM signal transitions with a second edge before the first edge of the output PWM signal transitions, drive the high-side and low-side outputs to delay a second edge of the output PWM signal based on the first edge of the output PWM signal, where the second edge of the input PWM signal is a next edge of the input PWM signal after the first edge of the input PWM signal, and where the second edge of the output PWM signal is a next edge of the output PWM signal after the first edge of the output PWM signal.

BRIEF DESCRIPTION OF THE DRAWINGS

For a more complete understanding of the present invention, and the advantages thereof, reference is now made to the following descriptions taken in conjunction with the accompanying drawings, in which:

FIGS. 21A and 21B illustrate the type A pulse generator circuits of FIG. 20, and associated waveforms, respectively, according to an embodiment of the present invention;

FIGS. 22A and 22B illustrate the type B pulse generator circuits of FIG. 20, and associated waveforms, respectively, according to an embodiment of the present invention;

FIGS. 23A and 23B illustrate the type C delay circuit of FIG. 20, and associated waveforms, respectively, according to an embodiment of the present invention; and FIGS. 24A and 24B illustrate the type D delay circuit of FIG. 20, and associated waveforms, respectively, according to an embodiment of the present invention.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, a PWM circuit and method implemented in a class-D amplifier, e.g., for audio applications. Some embodiments may be implemented in other types of amplifiers/circuits and/or for other types of applications.

In an embodiment of the present invention, a PWM signal provided to a driver for controlling an output stage of a class-D amplifier is automatically modified based on a switching status of an output signal of the output stage. When the output signal is near clipping, a pre-conditioning circuit coupled between a PWM modulator and the driver dynamically limits the duty-cycle of the PWM signal so that the duty cycle does not reach 0% or 100% immediately during top/bottom duty cycle range of input. In some embodiments, the pre-conditioning circuit removes (skips) PWM pulses having a pulse width that is lower than the driver delay, which advantageously lowers power dissipation while keeping the oscillations in a relatively high frequency and inaudible band, and without introducing additional delays to the input of the class-D amplifier.

Figure 1:
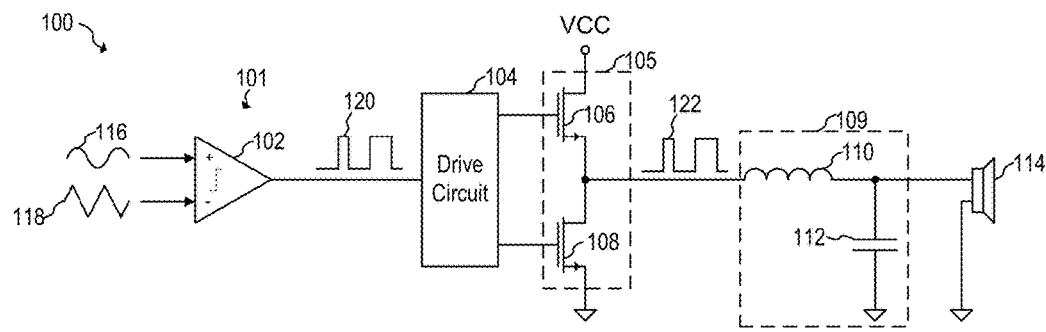
FIG. 1 shows a schematic diagram of a conventional class-D amplifier for driving an audio speaker.
Figure 2:
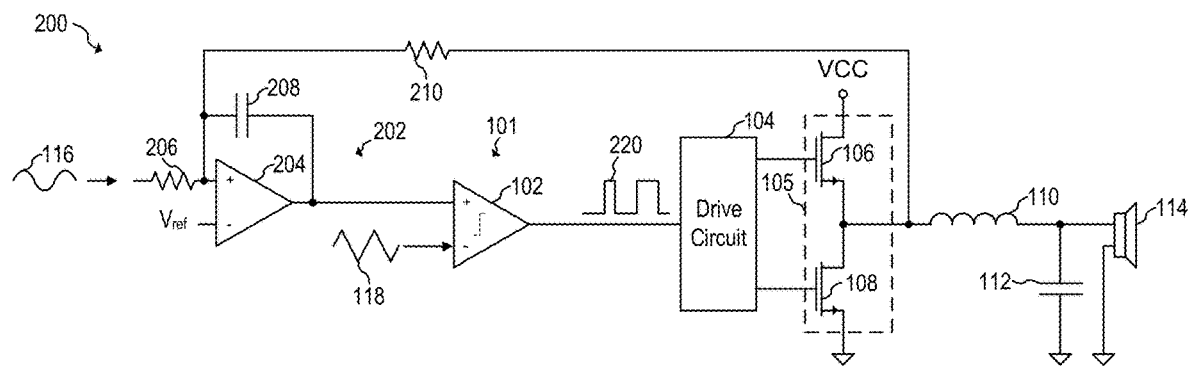
FIG. 2 shows a schematic diagram of another conventional class-D amplifier for driving an audio speaker.
Figure 3:
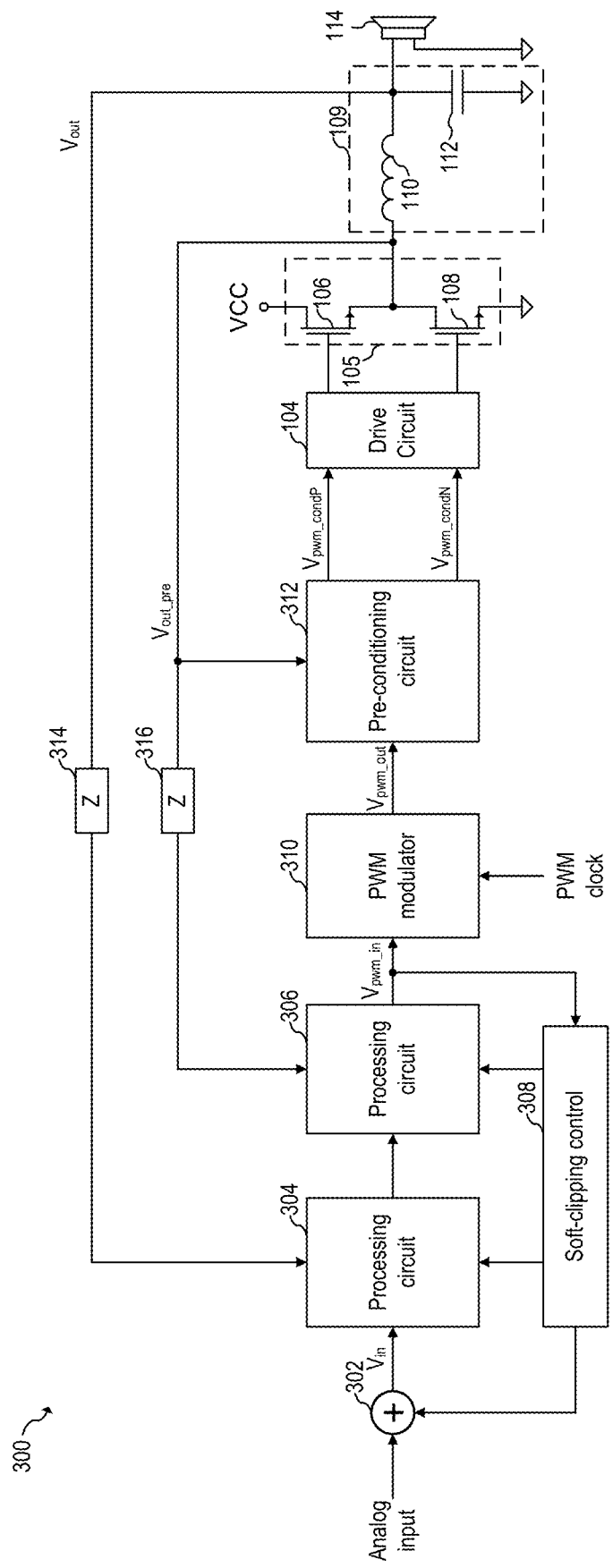
FIG. 3 shows a class-D amplifier, according to an embodiment of the present invention.

FIG. 3 shows class-D amplifier 300, according to an embodiment of the present invention. Class-D amplifier 300 includes processing circuits 304 and 306, PWM modulator 310, pre-conditioning circuit 312, drive circuit 104, output stage 105, feedback circuits 314 and 316, soft-clipping control circuit 308, and summation circuit 302.

During normal operation, output stage 105 drives speaker 114 via low-pass filter 109 based on the analog input signal. The analog input is modified by circuits 302, 304, and 306 to generate signal $V_{pwm\_in}$. PWM modulator 310 generates PWM signal $V_{pwm\_out}$ based on analog signal $V_{pwm\_in}$, e.g., in a similar manner as PWM modulator 101.

Pre-conditioning circuit 312 generates conditioned PWM signal $V_{pwm\_cond}$ based on PWM signal $V_{pwm\_out}$ and based on pre-filter output voltage $V_{out\_pre}$. For example, in some embodiments, pre-conditioning circuit 312 generates signal conditioned PWM signal $V_{pwm\_cond}$ to limit the duty cycle of signal $V_{out\_pre}$ to a maximum (minimum) duty-cycle when the duty cycle of signal $V_{out\_pre}$ is near clipping, and causes conditioned PWM signal $V_{pwm\_cond}$ to be identical (or substantially identical) to PWM signal $V_{pwm\_out}$ when the duty cycle of signal $V_{out\_pre}$ is not near clipping. As will be described in more detail later, in some embodiments, the duty cycle clipping value is not a fixed preset value. Instead, in some embodiments, the duty cycle clipping value is dynamically determined and is controlled by the state of output $V_{out\_pre}$ of output stage 105, thereby advantageously optimizing the clipping to maximum (minimum) value near 100% (0%) to allow for a full swing PWM transition according to the process, supply voltage level, and temperature (PVT) variations.

In some embodiments, pre-conditioned circuit 312 reduces the width of the pulse of PWM signal $V_{pwm\_cond}$ compared to the width of the pulse of PWM signal $V_{pwm\_out}$ to have a preset width when the second edge of the pulse of PWM signal $V_{pwm\_out}$ occurs when signal $V_{out\_pre}$ start to interact with $V_{pwm\_cond}$.

As shown in FIG. 3, in some embodiments, pre-conditioned PWM signal $V_{pwm\_cond}$ may include a high-side signal $V_{pwm\_condP}$ for controlling the high-side transistor (e.g., 106) and a low-side signal $V_{pwm\_condN}$ for controlling the low-side transistor (e.g., 108).

Output stage 105 may be implemented in any way known in the art, such as with NMOS transistors 106 and 108. Other implementations, such as using transistors of the different type (e.g., the high-side transistors being of the p-type while the low-side transistor being of the n-type), and/or transistors of other technologies, may also be used. For example, in some embodiments, transistors 106 and 108 are double-diffused MOSFETs (DMOS) transistors.

In some embodiments, a bootstrap capacitor (not shown) may be used for driving transistors 106 and 108 in ways known in the aft.

Drive circuit 104 may be implemented in any way known in the art, such as by using conventional gate drivers.

PWM modulator 310 may be implemented in any way known in the art. For example, in some embodiments, PWM modulator 310 may be implemented in a similar manner as PWM modulator 101.

In some embodiments, processing circuits 304 and 306 each may include integrator circuits, e.g., similar to integrator 202, and may sum the signals from respective feedback circuits 314 and 316 and input voltage $V_{in}$. For example, in some embodiments, processing circuit 306 is implemented identically as integrator 202, and processing circuit 304 is implemented similarly as integrator 202 but with additional compensation (zeros).

In some embodiments, soft-clipping control circuit 308 provides negative feedback from signal $V_{pwm\_in}$ back to the input of class-D amplifier 300 (using summing circuit 302), e.g., to correct non-linearities in the transfer function of the driver 104. Soft-clipping control circuit 308 may be implemented in any way known in the art.

In some embodiments, the negative feedback loops of class-D amplifier 300, which include feedback circuits 314 and 316 and soft-clipping control circuit 308 advantageously allow for improving performance, such as improving PSRR and THD, for example.

Figure 4:
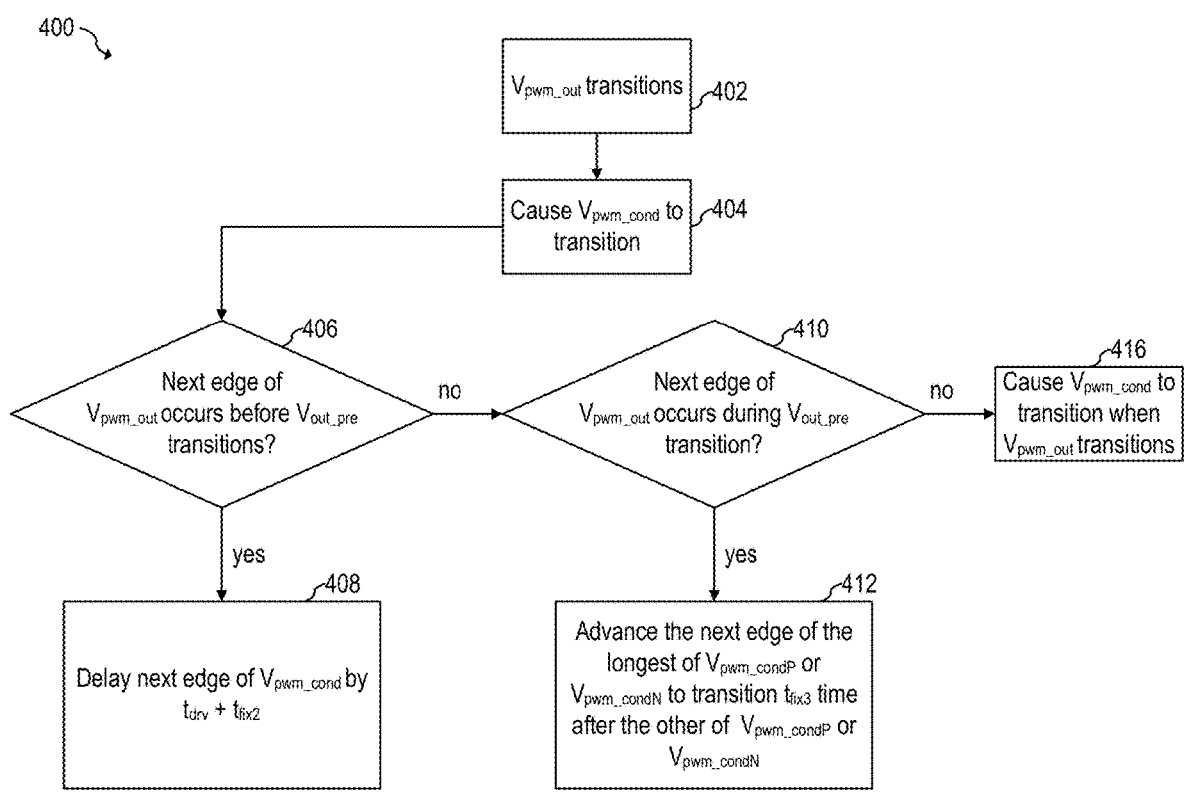
FIG. 4 shows a flow chart of an embodiment method for conditioning a PWM signal, according to an embodiment of the present invention.

FIG. 4 shows a flow chart of embodiment method 400 for conditioning a PWM signal, according to an embodiment of the present invention.

During step 402, PWM signal $V_{pwm\_out}$, which is the input to pre-conditioning circuit 312, transitions (either with a rising edge or a falling edge).

During step 404, conditioned PWM signal $V_{pwm\_cond}$ transitions based on PWM signal $V_{pwm\_out}$, which in turn controls drive circuit 104 so that transistors 106 and 108 transition, thus causing a transition of voltage $V_{out\_pre}$. For example, in some embodiments, signals $V_{pwm\_condP}$ and $V_{pwm\_condN}$ have a preset delay $t_{fix1}$ during the transition occurring during step 404, e.g., to avoid X-conduction.

During step 406, it is determined whether the next edge of PWM signal $V_{pwm}$ occurs before $V_{out\_pre}$ transitions. If the next edge of PWM signal $V_{pwn\_out}$ occurs before voltage $V_{out\_pre}$ transitions, then the duty cycle is near clipping (e.g., below 5% or above 95%), and the next edge of $V_{pwm\_cond}$ is delayed during step 408 so that the duty cycle of $V_{out\_pre}$ is limited. In some embodiments, the next edge is delayed by a preset time $t_{fix2}$ plus a driver delay $t_{drv}$, where driver delay $t_{drv}$ is the delay between driver 104 receiving a transition and signal $V_{out\_pre}$ transitioning). In some embodiments, preset delays $t_{fix1}$ and $t_{fix2}$ are equal. In some embodiments, since the next edge of $V_{pwm\_cond}$ is delayed based on driver delay $t_{drv}$, such delay is dynamic and based, e.g., on process, voltage and temperature (PVT) variations. Therefore, some embodiments can advantageously avoid using a worst case scenario (e.g., longer) delay to account for worst case PVT conditions.

In some embodiments, both signals $V_{pwm\_condP}$ and $V_{pwm\_condN}$ transition simultaneously after the $t_{drv}$ plus $t_{fix2}$ instead of having the preset delay $t_{fix1}$ in between since, in some embodiments, the response time between the high-side transistor (e.g., 106) and low-side transistor (e.g., 108) are different and advantageously avoid X-conduction, e.g., without requiring the introduction of a preset delay during step 408.

In some embodiments, the determination of whether the next edge of PWM signal $V_{pwm\_out}$ does not occur before $V_{out\_pre}$ transitions is based on whether the transition of the next edge of PWM signal $V_{pwm\_out}$ plus driver delay tare occurs (or would have occurred) before $V_{out\_pre}$ transitions.

If the next edge of PWM signal $V_{pwm\_out}$ does not occur before $V_{out\_pre}$ transitions, during step 410, it is determined whether the next edge of PWM signal $V_{pwm\_out}$ occurs while $V_{out\_pre}$ transitions. If the next edge of PWM signal $V_{pwm\_out}$ occurs while voltage $V_{out\_pre}$ transitions, then the next edge of the longer between $V_{pwm\_condP}$ and $V_{pwm\_condN}$ is advanced during step 412 so that it transitions, e.g., after a preset delay $t_{fix3}$ from the transition of the other of $V_{pwm\_condP}$ and $V_{pwm\_condN}$, where $t_{fix3}$ is smaller than $t_{fix1}$. In some embodiments, delay $t_{fix3}$ is not fixed, and, instead, may be determined by detections signals (e.g., $V_{boost\_on}$ or $V_{slow\_off}$).

If it is determined during step 410 that the next edge of PWM signal $V_{pwm\_out}$ occurs after $V_{out\_pre}$ transitions, then conditioned PWM signal transitions when $V_{pwm\_out}$ transitions, and with signals $V_{pwm\_condP}$ and $V_{pwm\_condN}$ having a preset delay $t_{fix1}$ during the transition occurring during step 416.

In some embodiments, steps 410 and 416 may be omitted, and step 412 is always performed if the output of step 406 is "no."

FIGS. 5-8 shows waveforms of signals of class-D amplifier 300, according to an embodiment of the present invention.

Figure 5:
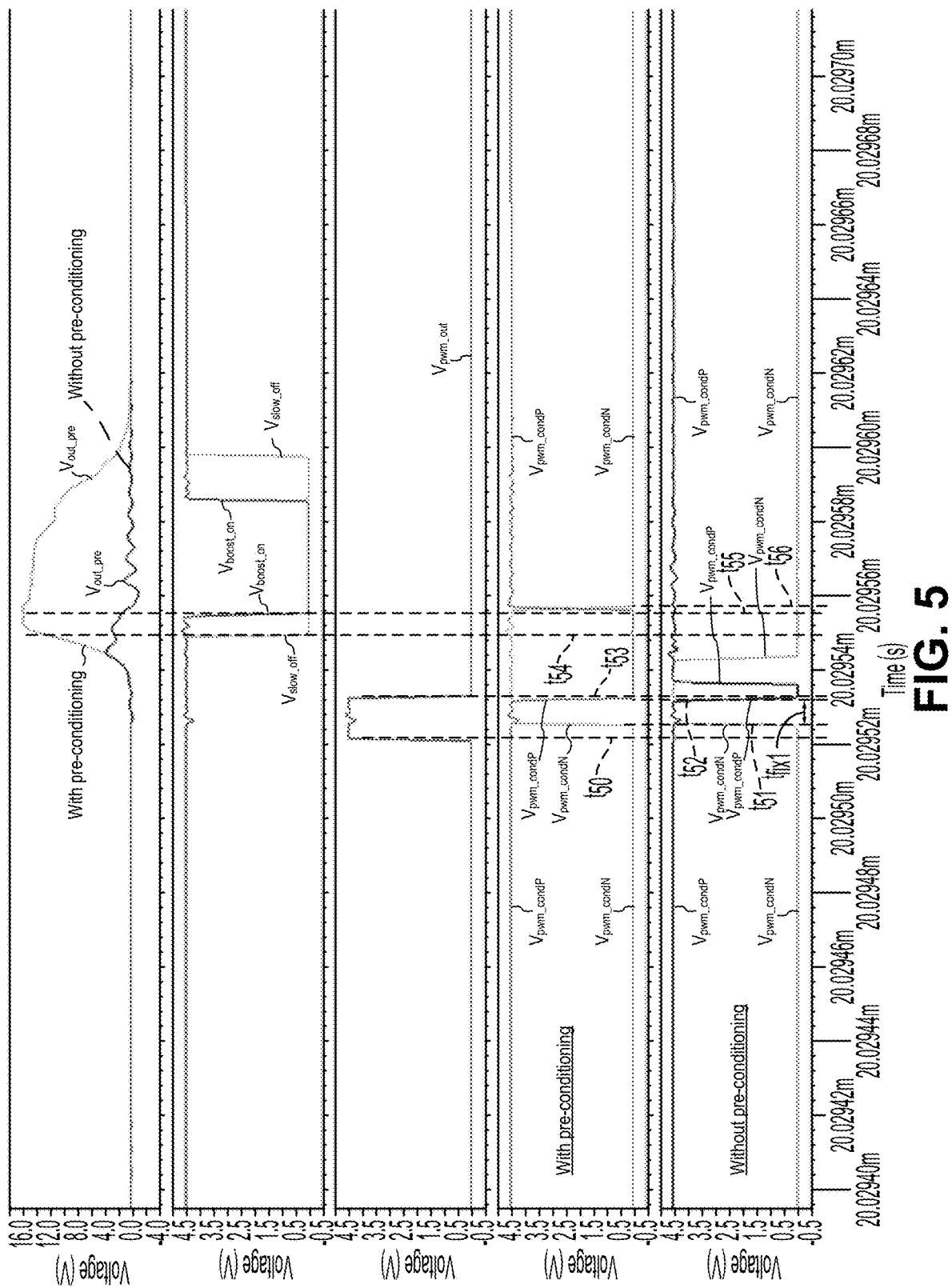
FIGS. 5-8 shows waveforms of signals of the class-D amplifier of FIG. 3, according to an embodiment of the present invention.

FIG. 5 illustrates waveforms in which the duty cycle is increased to a minimum duty cycle (step 408). As shown in FIG. 5, the rising edge of $V_{pwm\_out}$ occurs at time $t_{50}$ (step 402). At time $t_{51}$, $V_{pwm\_condN}$ transitions from low to high (step 404). At time $t_{52}$, which occurs after preset time $t_{fix1}$ after time $t_{51}$, $V_{pwm\_condP}$ transitions from high to low (step 404).

At time $t_{53}$, the falling edge of $V_{pwm\_out}$ (the next edge) occurs. Since the falling edge of $V_{pwm\_out}$ (the next edge) occurs before $V_{out\_pre}$ transitions (which occurs at time $t_{55}$) the outcome of step 406 is "yes" and both $V_{pwm\_condP}$ and $V_{pwm\_condN}$ transition at time $t_{56}$, which occurs a time $t_{fix2}+t_{drv}$ after $V_{pwm\_condP}$ transitions from high to low time (which occurs at time $t_{52}$).

As shown in FIG. 5, the reshaped $V_{out\_pre}$ signal has a minimum duty cycle, which is longer than the duty cycle that $V_{out\_pre}$ would have had without the pre-conditioning (as illustrated in FIG. 5). As can also be seen in FIG. 5, because of the response time of the high-side and low-side transistors, the original (lower) duty cycle is not sufficient to cause a full transition of $V_{out\_pre}$ (without pre-conditioning).

Figure 6:
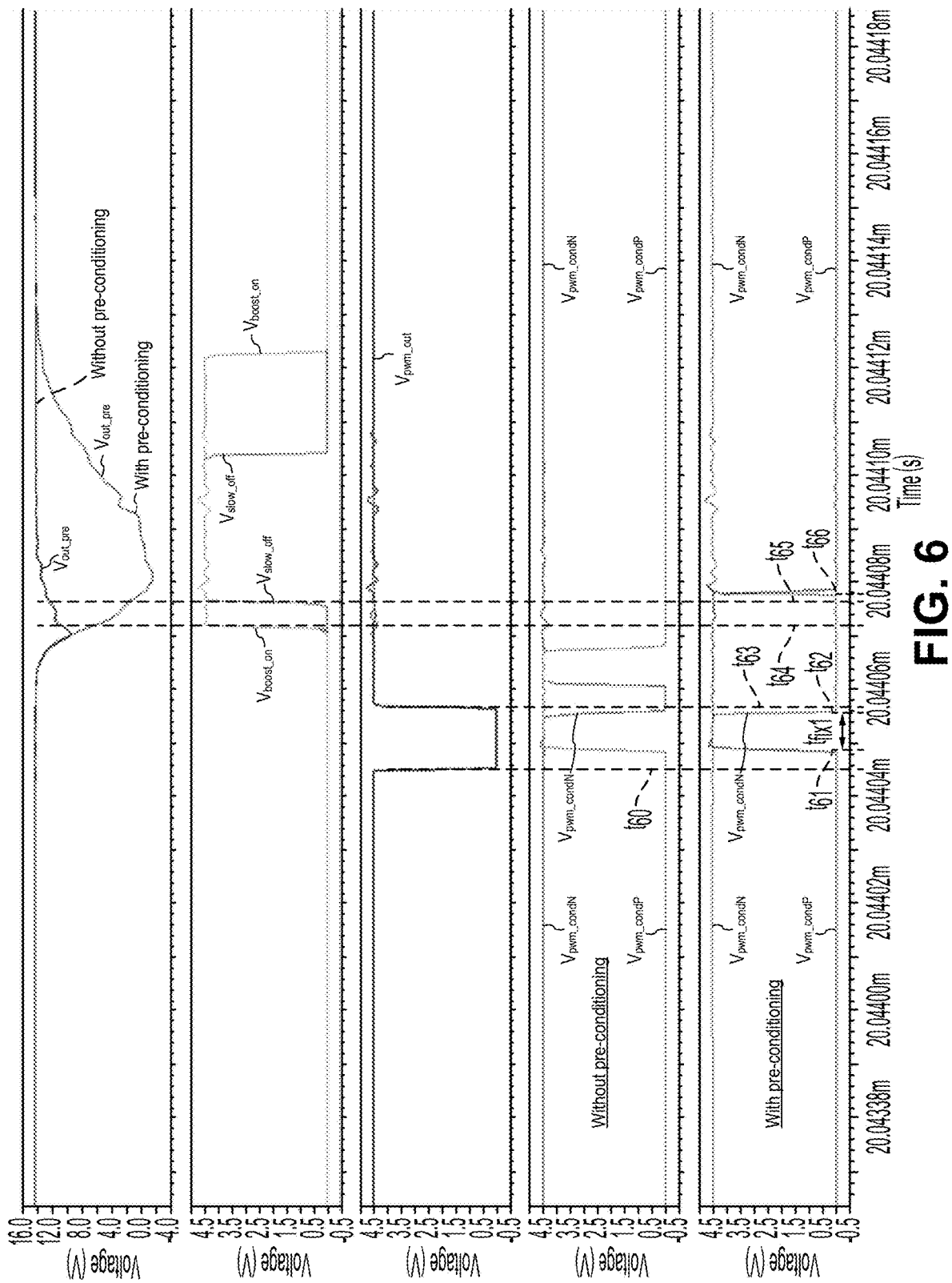

FIG. 6 illustrates waveforms in which the duty cycle is decreased to a maximum duty cycle (step 408). As shown in FIG. 6, the falling edge of $V_{pwn\_out}$ occurs at time $t_{60}$ (step 402). At time $t_{61}$, $V_{pwm\_condP}$ transitions from low to high (step 404). At time $t_{62}$, which occurs after preset time $t_{fix1}$ after time $t_{61}$, $V_{pwm\_condN}$ transitions from high to low (step 404). As shown, in some embodiments, time $t_{fix1}$ may be about 8 nS. Other values may also be used.

At time $t_{63}$, the rising edge of $V_{pwm\_out}$ (the next edge) occurs. Since the rising edge of $V_{pwm\_out}$ (the next edge) occurs before $V_{out\_pre}$ transitions (which occurs at time $t_{65}$) the outcome of step 406 is "yes" and both $V_{pwn\_condP}$ and $V_{pwm\_condN}$ transition at time $t_{66}$, which occurs a time $t_{fix2}+t_{drv}$ after $V_{pwm\_condP}$ transitions from low to high time (which occurs at time $t_{62}$).

As shown in FIG. 6, the reshaped $V_{out\_pre}$ signal has a maximum duty cycle, which is shorter than the duty cycle that $V_{out\_pre}$ would have had without the pre-conditioning (as illustrated in FIG. 6). As can also be seen in FIG. 6, because of the response time of the high-side and low-side transistors, the original (higher) duty cycle is not sufficient to cause a full transition of $V_{out\_pre}$ (without pre-conditioning).

Figure 7:
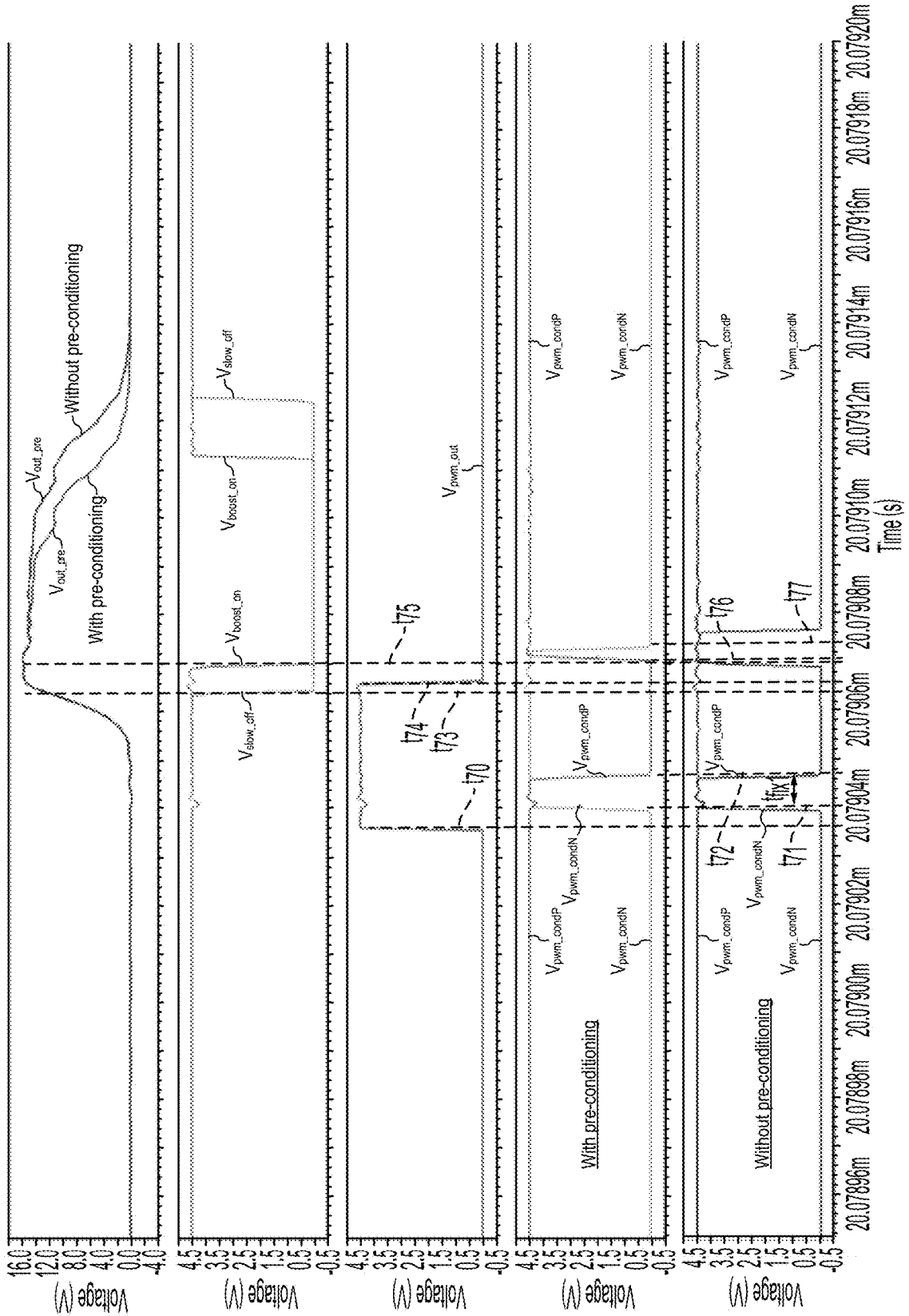

FIG. 7 illustrates waveforms in which the width of the pulse of PWM signal $V_{pwm\_cond}$ is reduced (step 412), during a positive pulse of $V_{pwm\_out}$. As shown in FIG. 7, the rising edge of $V_{pwm\_out}$ occurs at time $t_{70}$ (step 402). At time $t_{71}$, $V_{pwm\_condN}$ transitions from low to high (step 404). At time $t_{72}$, which occurs after preset time $t_{fix1}$ after time $t_{71}$, $V_{pwm\_condP}$ transitions from high to low (step 404).

At time $t_{74}$, the falling edge of $V_{pwm\_out}$ (the next edge) occurs. Since the falling edge of $V_{pwm\_out}$ (the next edge) occurs while $V_{out\_pre}$ transitions (which occurs between times $t_{73}$ and $t_{75}$) the outcome of step 406 is "no," the outcome of step 408 is "yes," and thus, $V_{pwm\_condN}$ is advanced to transitions at time $t_{77}$, which occurs preset time $t_{fix3}$ after $V_{pwm\_condP}$ transition at time $t_{76}$ (step 412). In some embodiments, a detection signal (e.g., $V_{boost\_on}$ in this example) causes $V_{pwm\_condP}$ to transition at time $t_{76}$. As illustrated in more detail later in FIG. 15, in some embodiments, the transition of $V_{pwn\_condN}$ at time $t_{77}$ is controlled by the latch that includes NAND gates 1518 and 1528.

As shown in FIG. 7, the reshaped $V_{out\_pre}$ positive pulse is shorter that the pulse without the pre-conditioning.

As also shown in FIG. 7, the time between the $V_{pwm\_condN}$ transition and the $V_{pwm\_condP}$ transition ($t_{77}$-$t_{76}$) is lower than $t_{fix1}$, which advantageously does not cause X-conduction because of the difference in response times between the high-side transistor (e.g., 106) and low-side transistor (e.g., 108).

Figure 8:
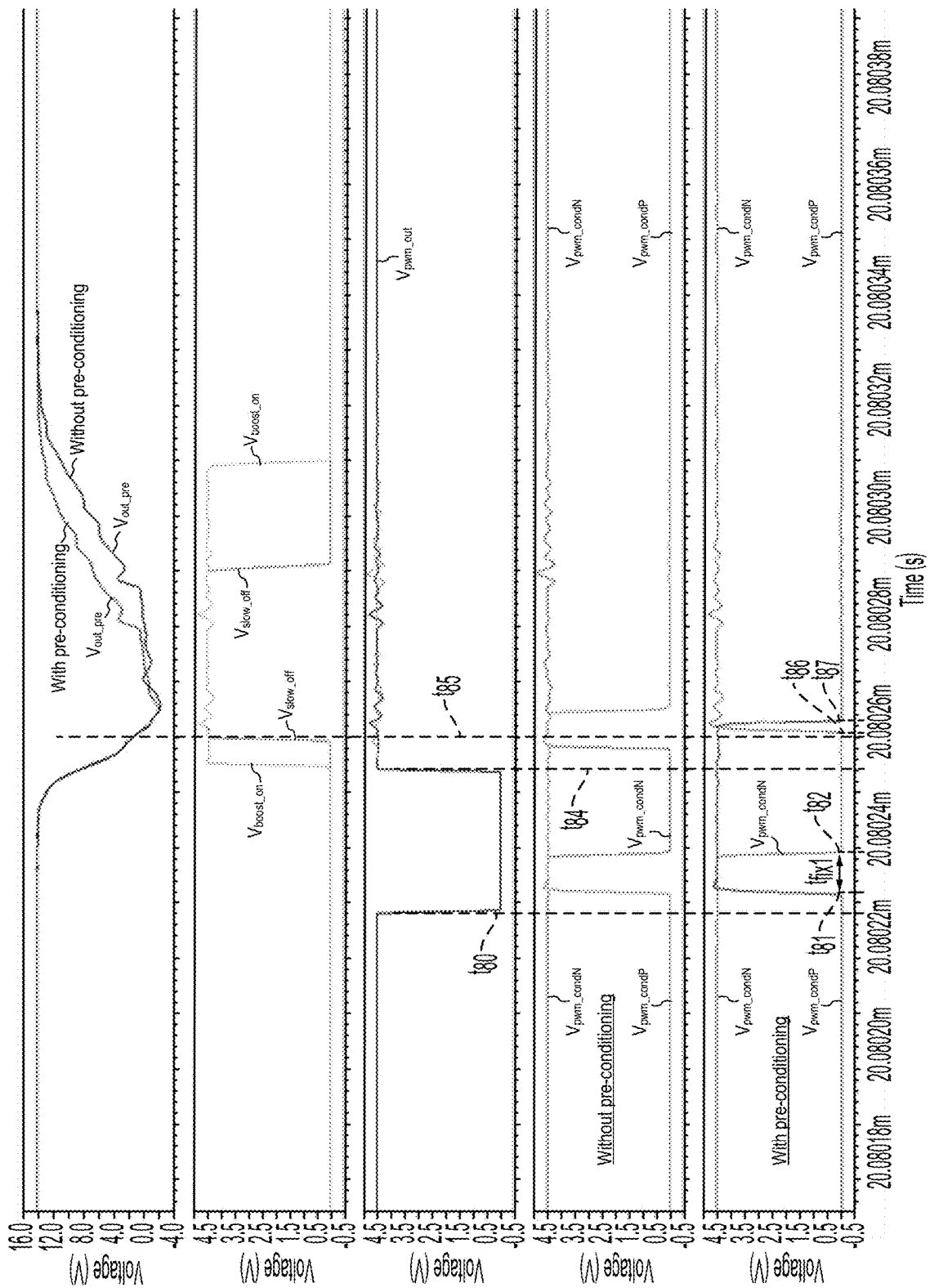

FIG. 8 illustrates waveforms in which the width of the pulse of PWM signal $V_{pwm\_cond}$ is reduced (step 412), during a negative pulse of $V_{pwm\_out}$. As shown in FIG. 8, the falling edge of $V_{pwm\_out}$ occurs at time $t_{80}$ (step 402). At time $t_{81}$, $V_{pwm\_condP}$ transitions from low to high (step 404). At time $t_{82}$, which occurs after preset time $t_{fix1}$ after time $t_{81}$, $V_{pwm\_condN}$ transitions from high to low (step 404).

At time $t_{84}$, the falling edge of $V_{pwm\_out}$ (the next edge) occurs. Since the falling edge of $V_{pwm\_out}$ (the next edge) occurs while $V_{out\_pre}$ transitions the outcome of step 406 is "no," the outcome of step 408 is "yes," and thus, $V_{pwm\_condP}$ is advanced to transitions at time $t_{87}$, which occurs preset time $t_{fix3}$ after $V_{pwm\_condN}$ transition at time $t_{86}$ (step 412). In some embodiments, a detection signal (e.g., $V_{slow\_off}$ in this example) causes $V_{pwm\_condN}$ to transition at time $t_{86}$. As illustrated in more detail later in FIG. 15, in some embodiments, the transition of $V_{pwm\_condP}$ at time $t_{87}$ is controlled by the latch that includes NAND gates 1518 and 1528.

In some embodiments, e.g., such as illustrated in FIG. 8, the zone of transition is determined based on the delay tare. For example, in some embodiments, next edge of $V_{pwm\_out}$ does not occur before $V_{out\_pre}$ transitions (output of step 406=no) if the transitioning of $V_{pwm\_out}$ plus driver delay $V_{drv}$ occurs after the detection signal (in this example $V_{boost\_on}$) transitions.

As shown in FIG. 8, the reshaped $V_{out\_pre}$ negative pulse is shorter that the pulse without the pre-conditioning.

As also shown in FIG. 8, the time between the $V_{pwm\_condP}$ transition and the $V_{pwm\_condN}$ transition ($t_{87}$-$t_{86}$) is lower than $t_{fix1}$, which advantageously does not cause X-conduction because of the difference in response times between the high-side transistor (e.g., 106) and low-side transistor (e.g., 108).

Figure 9:
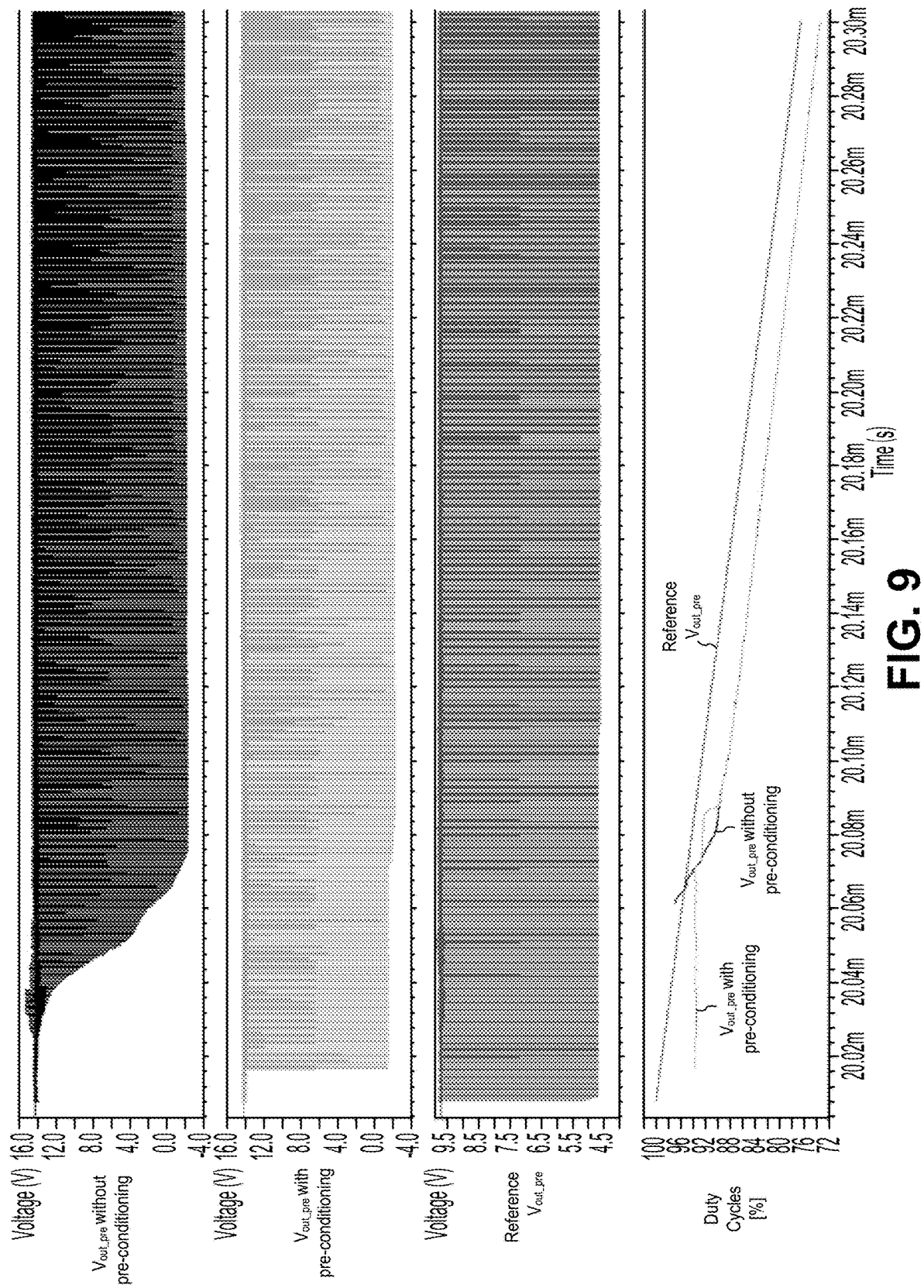
FIGS. 9 and 10 illustrate the duty cycles of the conditioned pre-filter output voltage of the class-D amplifier of FIG. 3, according to an embodiment of the present invention.
Figure 10:
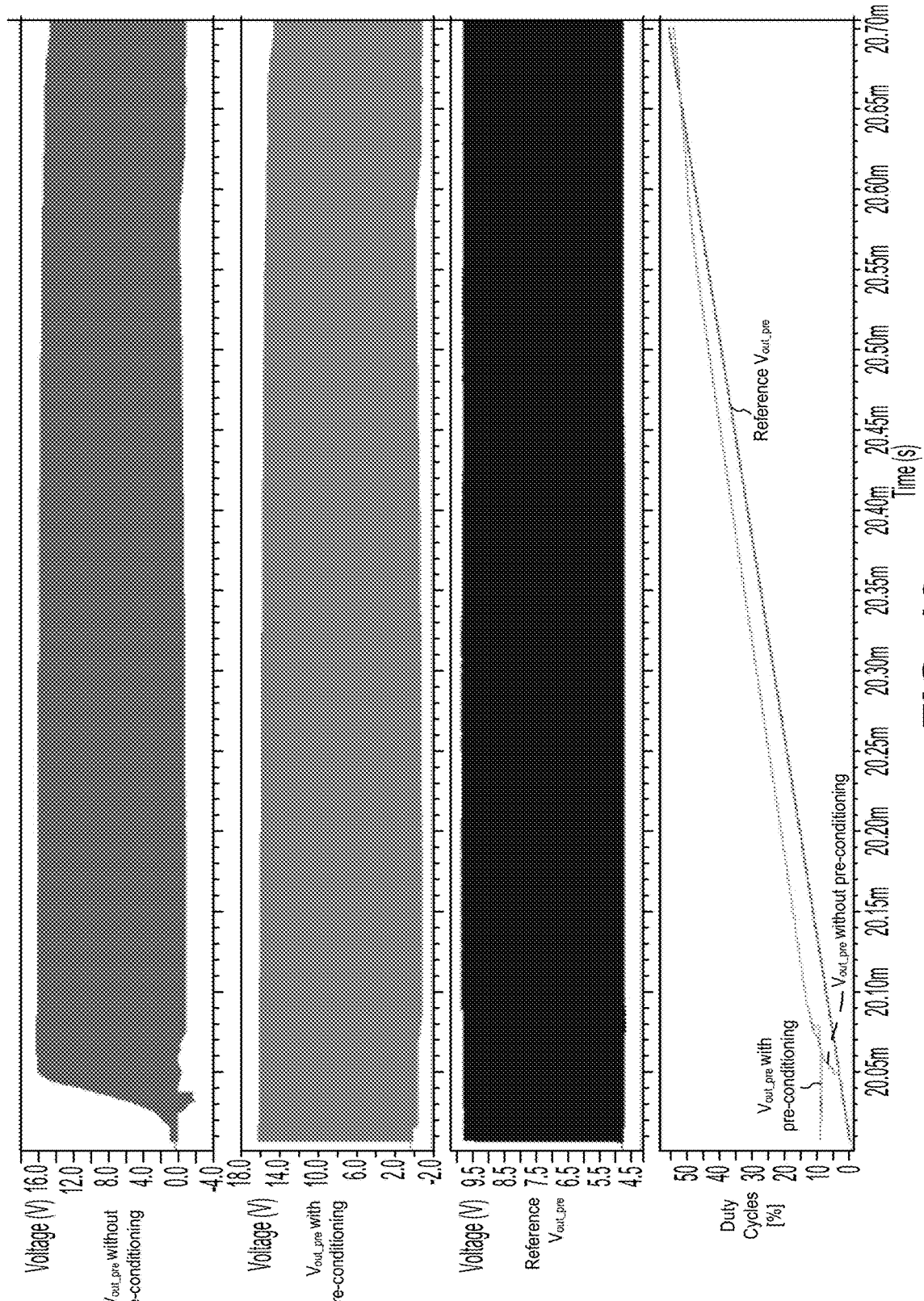

FIGS. 9 and 10 illustrate a comparison between the duty cycles of the voltage $V_{out\_pre}$ with pre-conditioning, $V_{out\_pre}$ without pre-conditioning, and a reference $V_{out\_pre}$ (assuming normal output stage and gate drivers and without pre-conditioning) when operated in open loop (without feedback circuits 308, 314, and 316), according to an embodiment of the present invention. As shown in FIG. 9, as the duty cycle approaches 100%, the duty cycle of the pre-conditioned $V_{out\_pre}$ is limited (in this embodiment to about 10% duty cycle). Similarly, FIG. 10 shows that as the duty cycle approaches 0%, the duty cycle of the pre-conditioned $V_{out\_pre}$ is limited (in this embodiment to about 93% duty cycle).

As can also be seen from FIGS. 9 and 10, the duty cycles of the pre-conditioned $V_{out\_pre}$ and the $V_{out\_pre}$ without conditioning is about identical in the range of about 12% to about 90%.

Figure 11:
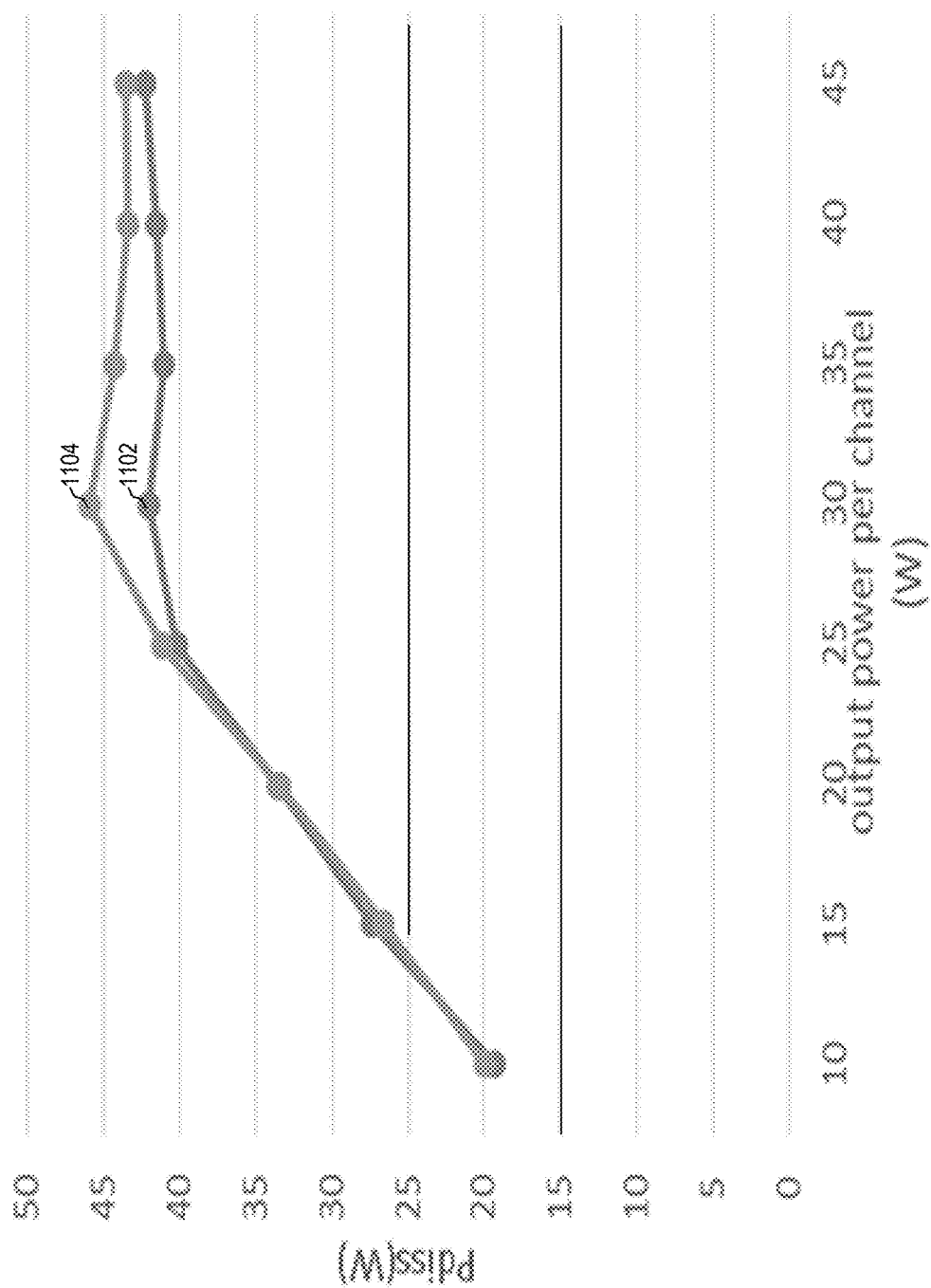
FIG. 11 illustrate simulation results of a comparison between the power consumption of the class-D amplifier of FIG. 3 with and without pre-conditioning, according to an embodiment of the present invention.

FIG. 11 illustrate simulation results of a comparison between the power consumption of class-D amplifier 300 with pre-conditioning (curve 1102) and without pre-conditioning (curve 1104), according to an embodiment of the present invention. As illustrated in FIG. 11, in some embodiments, pre-conditioning the PWM signal (e.g., by using circuit 312 and as illustrated in method 400) advantageously achieves a reduction in power when compared to non-preconditioned driving as the output power of amplifier 300 increases (and thus the duty cycle of $V_{out\_pre}$ goes near clipping).

Figure 13:
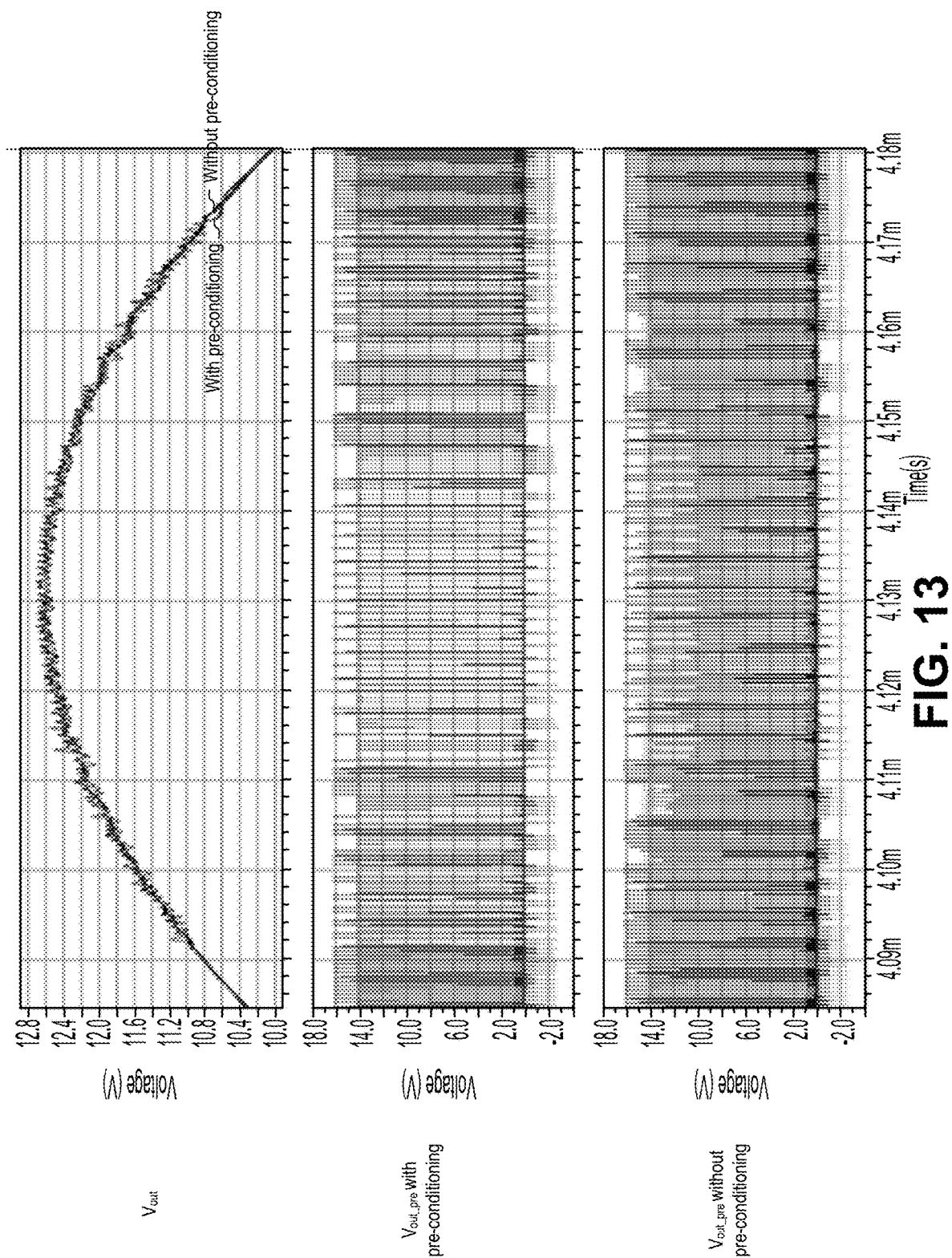
FIGS. 13 and 14 illustrate simulation results of pre and post-filter output signals, with and without preconditioning, of the class-D amplifier of FIG. 3, according to an embodiment of the present invention.
Figure 14:
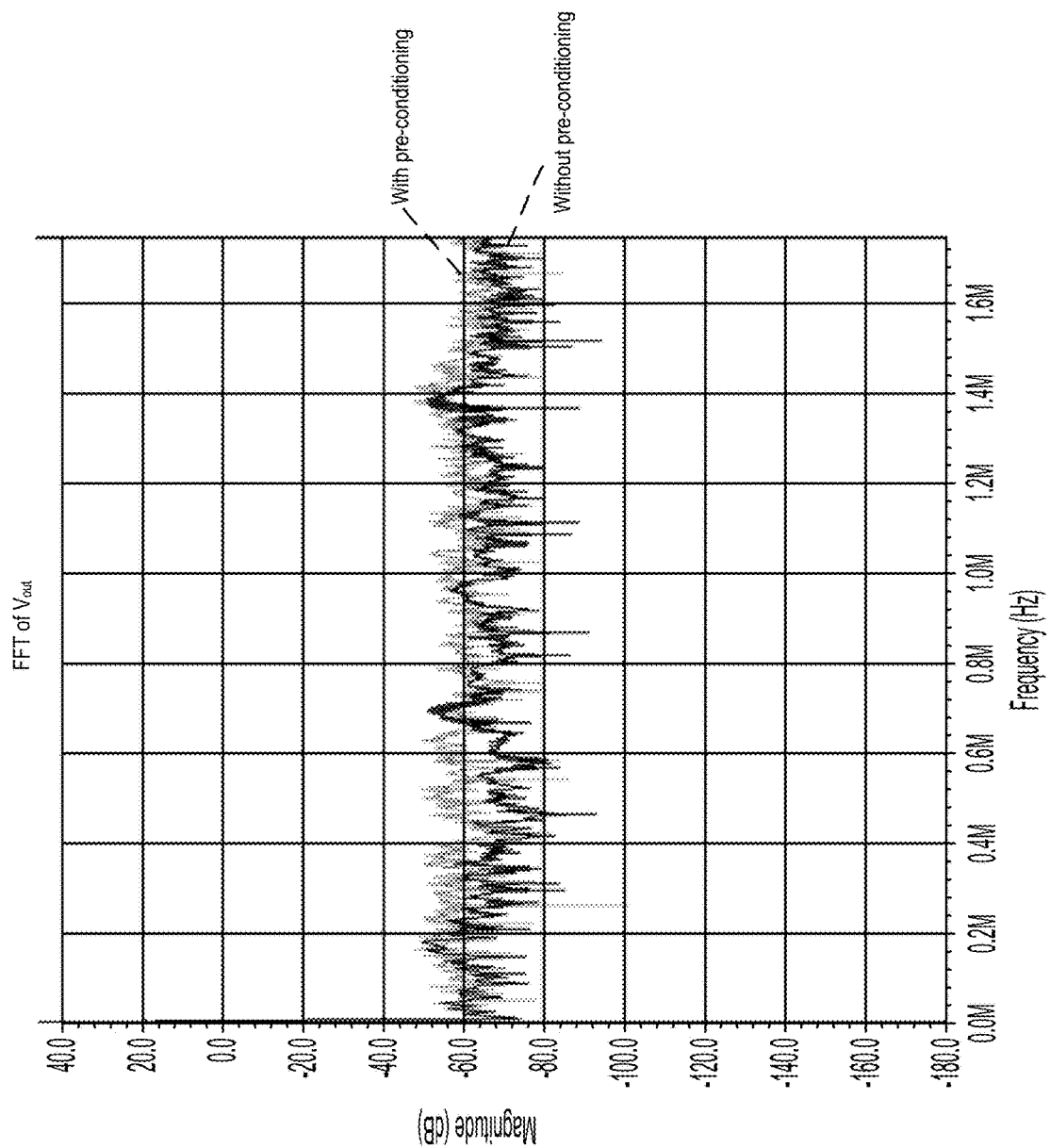

In some embodiments, the power savings are caused, in part, by amplifier 300 skipping short pulses when operating in closed loop. For example, in some embodiments, the clamped duty cycle makes the charge/discharge duration of LC filter 109 fixed when switching near clipping, which makes the feedback loop adjust the output switching frequency automatically to a lower frequency. Although there may be ripple on output $V_{out}$, the switching frequency near clipping could be move away from audible band (to a higher frequency) by adjusting the clamped duty cycle level, which in some embodiments, may be implemented by adding a delay to switching detection signals (e.g., $V_{boost\_on}$ and $V_{slow\_off}$ in FIG. 15). In this way, some embodiments advantageously achieve a good compromise between power dissipation and THD, e.g., as illustrated in FIGS. 11, 13, and 14 which may be desirable for high-frequency (HF) class-D amplifiers.

Figure 12:
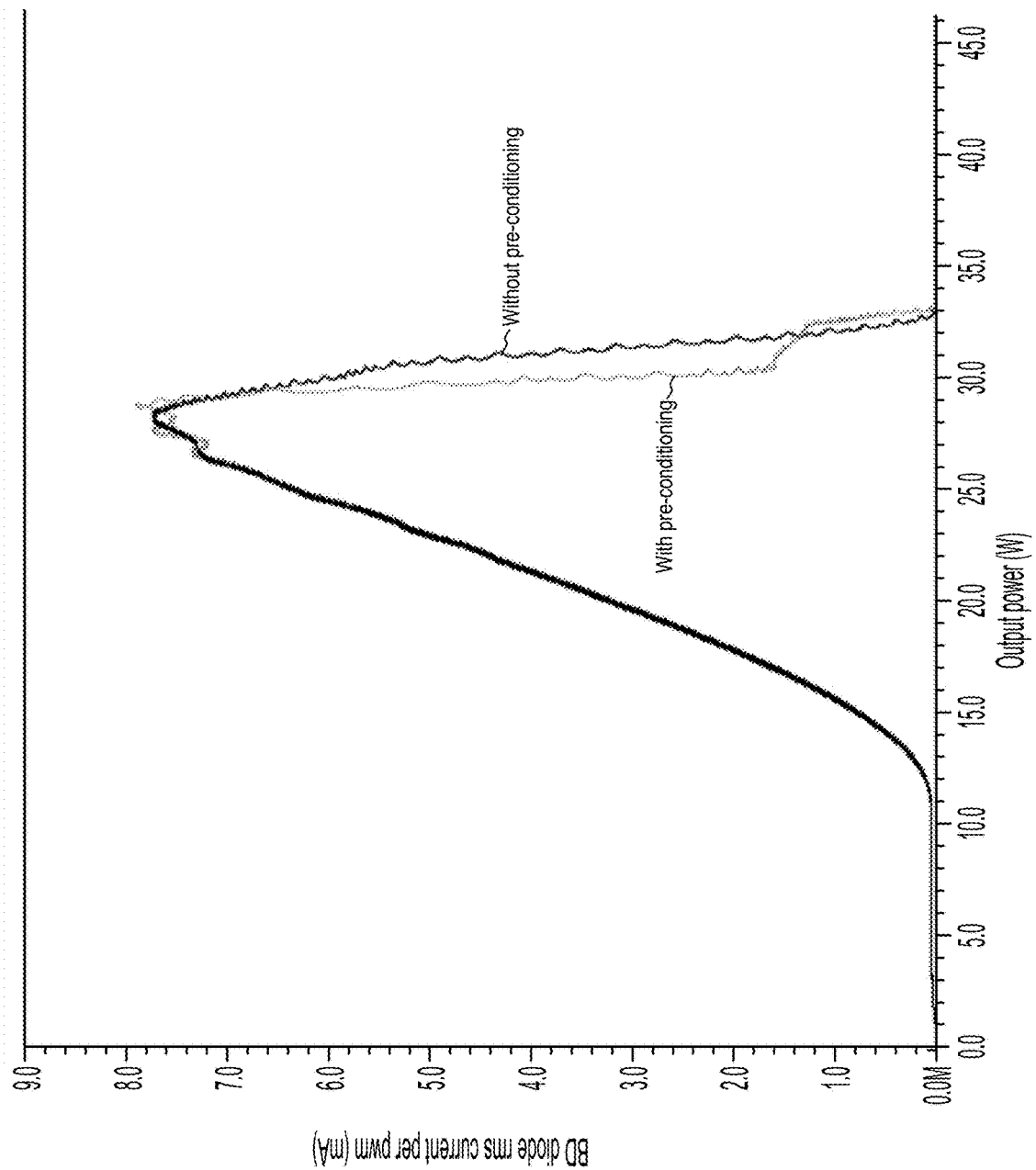
FIG. 12 illustrates Body-Drain diode RMS current of output power of transistors of the output stage of FIG. 3 when implemented as DMOS transistors of the n-type, according to an embodiment of the present invention.

FIG. 12 illustrates Body-Drain diode RMS current of output power of transistors 106 and 108 when implemented as DMOS transistors of the n-type during a transition of $V_{out\_pre}$, according to an embodiment of the present invention.

It is well known that higher BD diode charge storage inside power DMOS used in switching applications result in a higher dissipation and lower efficiency, since this charge is removed every DMOS switching cycle. As shown in FIG. 12, some embodiments exhibit a lower BD diode current for the same output power when pre-conditioning the PWM signal, thus advantageously resulting in lower power consumption.

In some embodiments, lowering the power consumption advantageously allows for improved thermal performance of amplifiers in, e.g., integrated solutions.

In some embodiments, pre-conditioning the PWM (e.g., with method 400) does not cause a degradation in THD performance. FIG. 13 illustrates simulation results of post-filter output signal $V_{out}$, and pre-filter output signal $V_{out\_pre}$ with and without preconditioning, when amplifier 300 is operated in closed loop, according to an embodiment of the present invention. FIG. 14 illustrates simulation results of an FFT of the post-filter output signal $V_{out}$, with and without preconditioning, when amplifier 300 is operated in closed loop, according to an embodiment of the present invention.

As can be seen in FIGS. 13 and 14, the THD of the non-pre-conditioned output $V_{out}$ is similar to the THD of the pre-conditioned output $V_{out}$. However, as can also be seen in FIG. 13, the switching frequency of the pre-conditioned pre-filtered output $V_{out\_pre}$ is significantly lower than the non-pre-filtered output $V_{out\_pre}$. Thus, in some embodiments, a balance can be advantageously achieved between the amount of THD degradation and the amount of power savings. In some embodiments, the duty cycle of $V_{pwm\_pre}$ can be adjusted by adding additional delays to switching detection signals (e.g., $V_{boost\_on}$ and $V_{slow\_off}$ in FIG. 15) to push the ripple frequency out of audible band.

Figure 15:
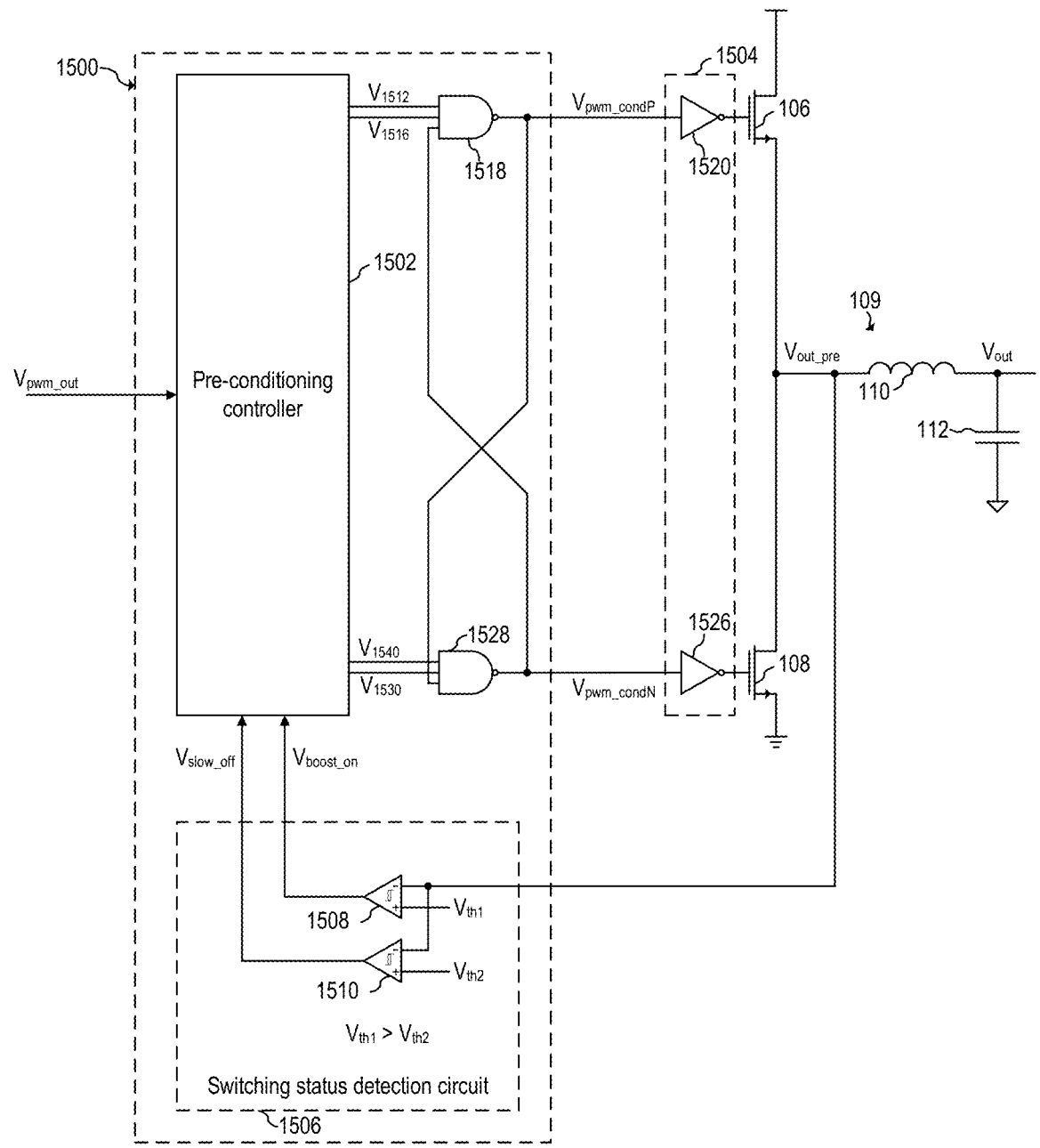
FIG. 15 shows pre-conditioning circuit of FIG. 3, according to an embodiment of the present invention.

FIG. 15 shows pre-conditioning circuit 1500, according to an embodiment of the present invention. Pre-conditioning circuit 1500 includes pre-conditioning controller 1502, switching status detection circuit 1506, and NAND gates 1518, and 1526. Switching status detection circuit 1506 includes comparators 1508 and 1510. Pre-conditioning circuit 312 may be implemented as pre-conditioning circuit 1500.

FIGS. 16-19 shows waveforms of signals associated with pre-conditioning circuit 1500, according to an embodiment of the present invention. FIG. 15 may be understood together with FIGS. 16-19. As can be seen, in some embodiments, FIGS. 16-19 correspond to FIGS. 5-8, respectively.

During normal operation, pre-conditioning circuit 1500 generates signals $V_{pwm\_condP}$ and $V_{pwm\_condN}$ to cause gate drive circuit 1504 to drive transistors 106 and 108 to cause signal $V_{out\_pre}$ to switch based on signal $V_{pwm\_out}$.

As shown in FIG. 15, some embodiments use NAND gates 1518 and 1528 in a latch configuration to prevent X-conduction. In some embodiments, other implementations for preventing X-conduction may also be used.

As shown in FIG. 15, switching status detection circuit 1506 generates detection signals $V_{boost\_on}$ and $V_{slow\_off}$ based on signal $V_{out\_pre}$. For example, in some embodiments, comparators 1508 and 1510, which may be implemented with hysteresis, are respectively used to generated signals $V_{boost\_on}$ and $V_{slow\_off}$ by comparing signal $V_{out\_pre}$ with thresholds $V_{th1}$ and $V_{th2}$, respectively, where threshold $V_{th1}$ is higher than threshold $V_{th2}$. Thus, in some embodiments, when $V_{out\_pre}$ transitions from low to high, $V_{slow\_off}$ transitions from high to low before $V_{boost\_on}$ transitions from high to low; and when $V_{out\_pre}$ transitions from high to low, $V_{boost\_on}$ transitions from low to high before $V_{slow\_off}$ transitions from low to high.

In some embodiments, thresholds $V_{th1}$ and $V_{th2}$ may be configurable and may be shifted, e.g., within a predetermined range.

Figure 16:
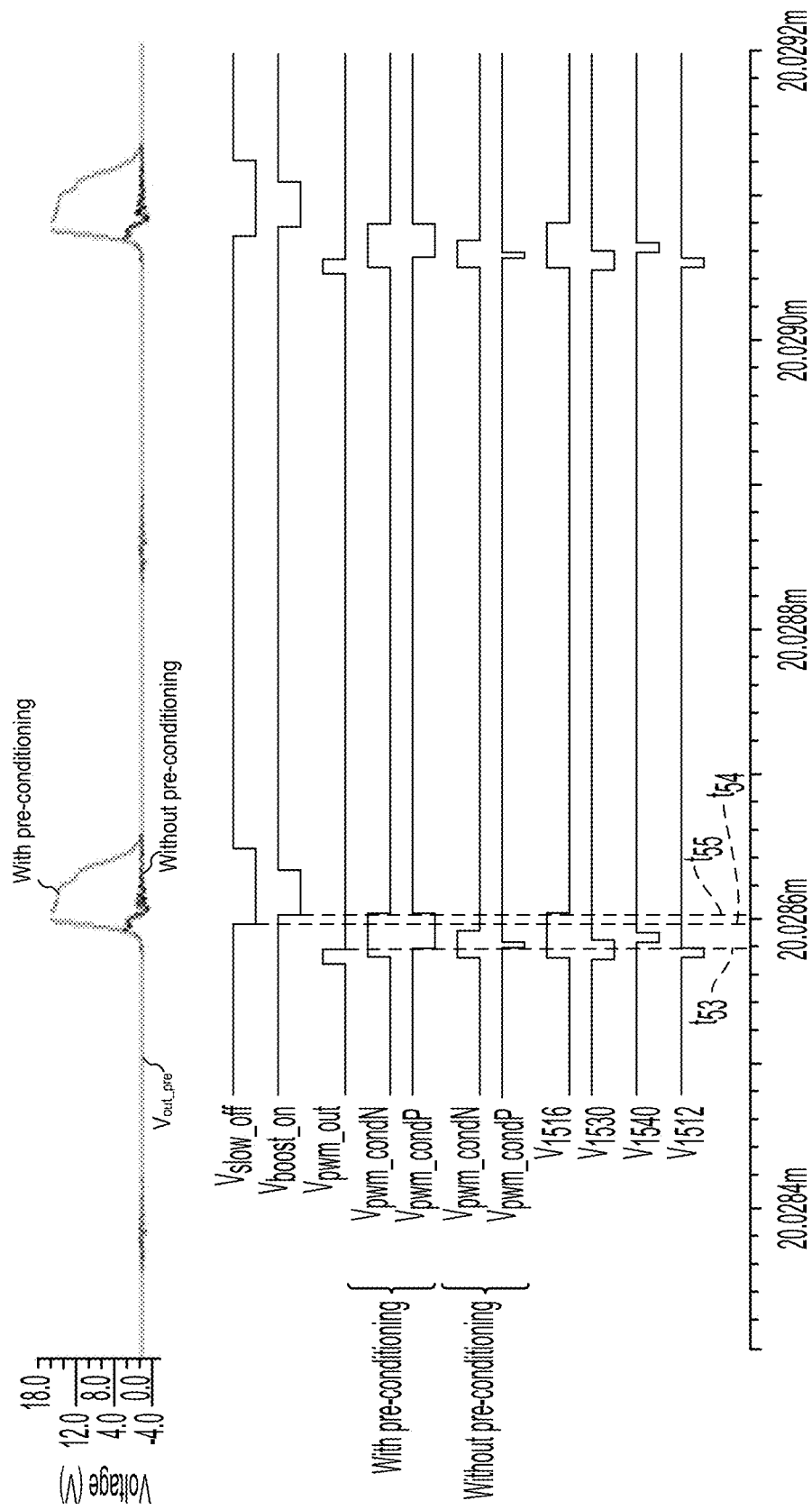
FIGS. 16-19 show waveforms of signals associated with the pre-conditioning circuit of FIG. 15, according to an embodiment of the present invention.

In some embodiments, pre-conditioning controller 1502 is configured to cause a delay (step 408) in signals $V_{pwm\_condP}$ and $V_{pwm\_condN}$ so that signals $V_{pwm\_condP}$ and $V_{pwm\_condN}$ switch, e.g., simultaneously, in response to signal $V_{boost\_on}$ transitioning from high to low when the duty cycle of $V_{pwm\_out}$ is lower than 50%, and when the falling edge of $V_{pwm\_out}$ occurs before $V_{out\_pre}$ transitions (e.g., before the falling edge of $V_{slow\_off}$), as illustrated, e.g., in FIG. 16.

Figure 17:
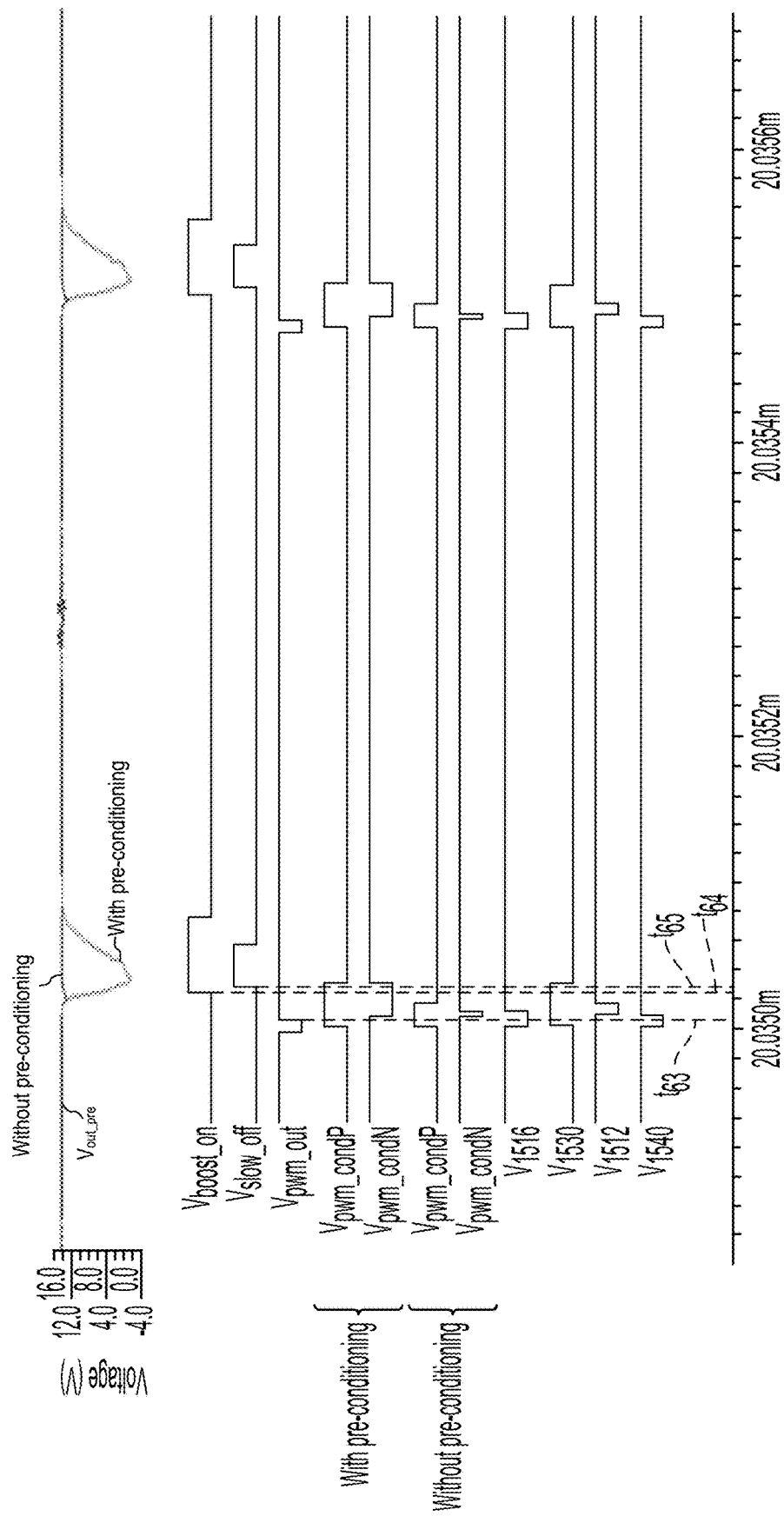

In some embodiments, pre-conditioning controller 1502 is configured to cause a delay (step 408) in signals $V_{pwm\_condP}$ and $V_{pwm\_condN}$ so that signals $V_{pwm\_condP}$ and $V_{pwm\_condN}$ switch, e.g., simultaneously, in response to signal $V_{slow\_off}$ transitioning from low to high when the duty cycle of $V_{pwm\_out}$ is higher than 50%, and when the rising edge of $V_{pwm\_out}$ occurs before $V_{out\_pre}$ transitions (e.g., before the rising edge of $V_{boost\_on}$), as illustrated, e.g., in FIG. 17.

Figure 18:
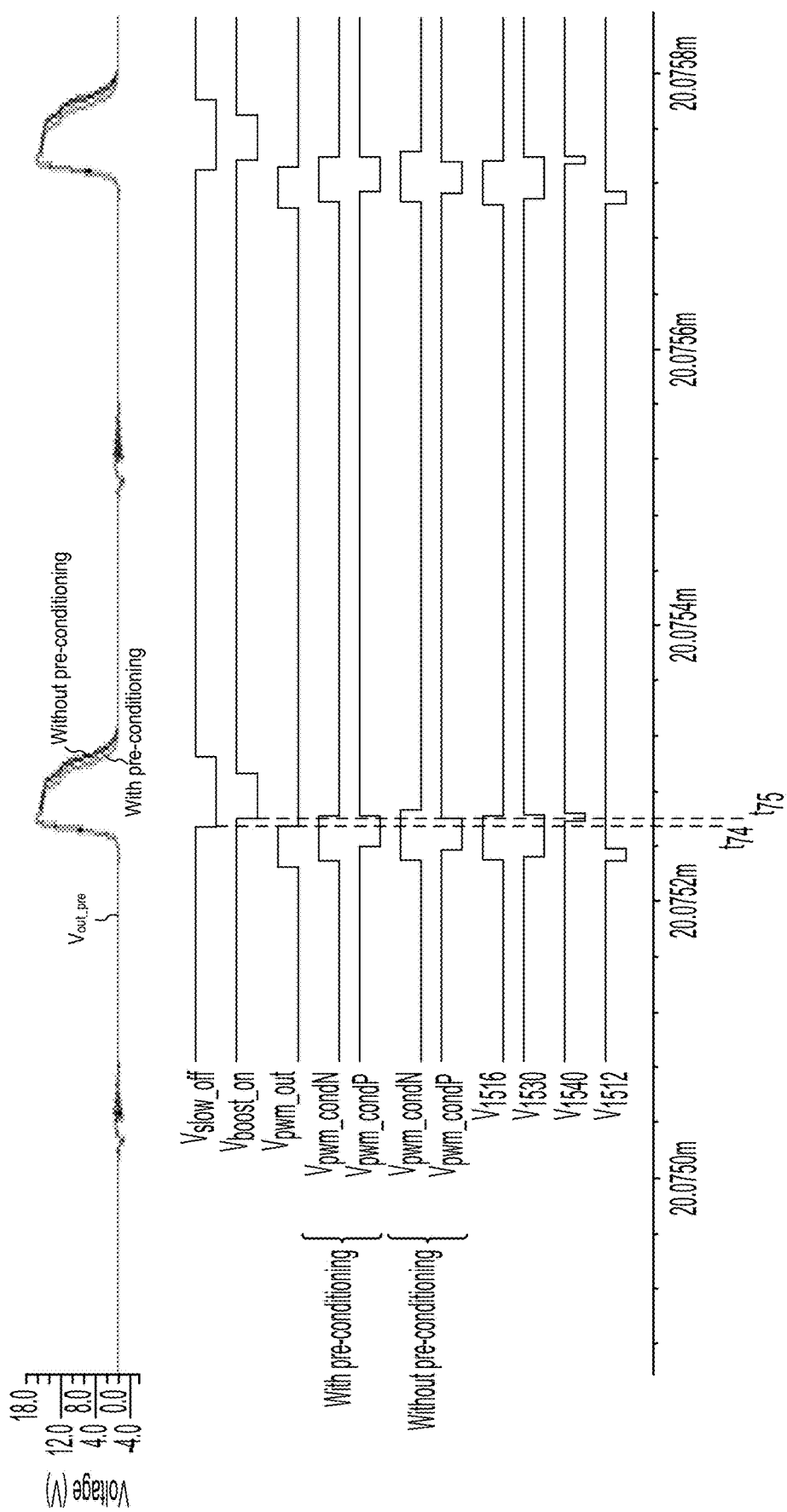

In some embodiments, pre-conditioning controller 1502 is configured to cause an advance (step 412) in the transitioning of signals $V_{pwm\_condN}$ so that signals $V_{pwm\_condN}$ and $V_{pwm\_condP}$ switch in response to signal $V_{boost\_on}$ transitioning from high to low when the duty cycle of $V_{pwm\_out}$ is lower than 50%, and when the falling edge of $V_{pwm\_out}$ does not occur before $V_{out\_pre}$ transitions, as illustrated, e.g., in FIG. 18.

Figure 19:
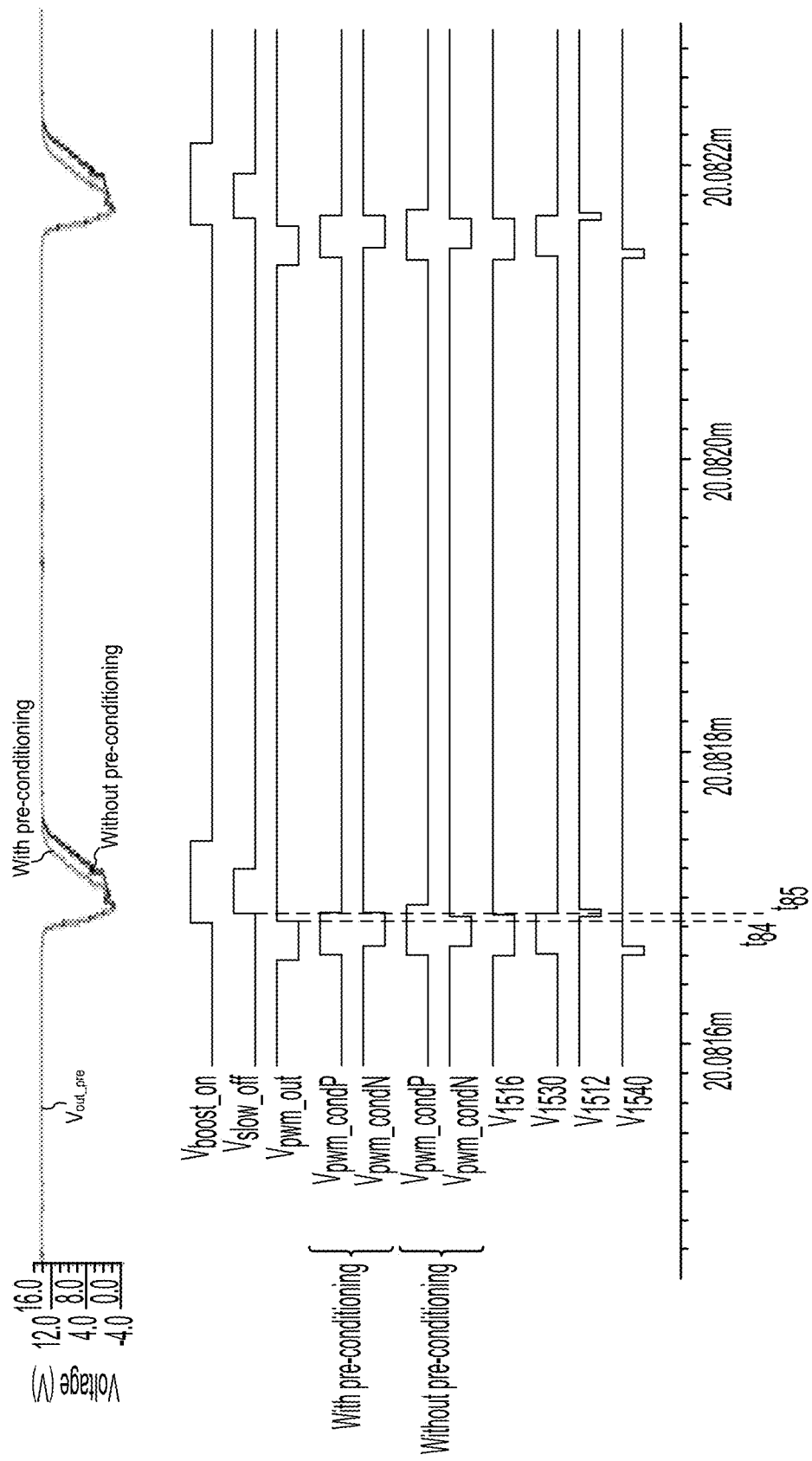

In some embodiments, pre-conditioning controller 1502 is configured to cause an advance (step 412) in the transitioning of signals $V_{pwm\_condP}$ so that signals $V_{pwm\_condN}$ and $V_{pwm\_condP}$ switch in response to signal $V_{slow\_off}$ transitioning from low to high when the duty cycle of $V_{pwm\_out}$ is higher than 50%, and when the rising edge of $V_{pwm\_out}$ does not occur before $V_{out\_pre}$ transitions, as illustrated, e.g., in FIG. 19.

As shown in FIG. 15, gate drive circuit 1504 may be implemented with inverting gate drivers 1520 and 1526. In some embodiments, non-inverting gate drivers may also be used instead of inverting gate drivers.

As shown in FIGS. 15-19, in some embodiments, pre-conditioning controller 1502 generates signals $V_{pwm\_condP}$ and $V_{pwm\_condN}$ by driving NAND gates 1518 and 1528 with signals $V_{1512}$, $V_{1516}$, $V_{1530}$, and $V_{1540}$.

Figure 20:
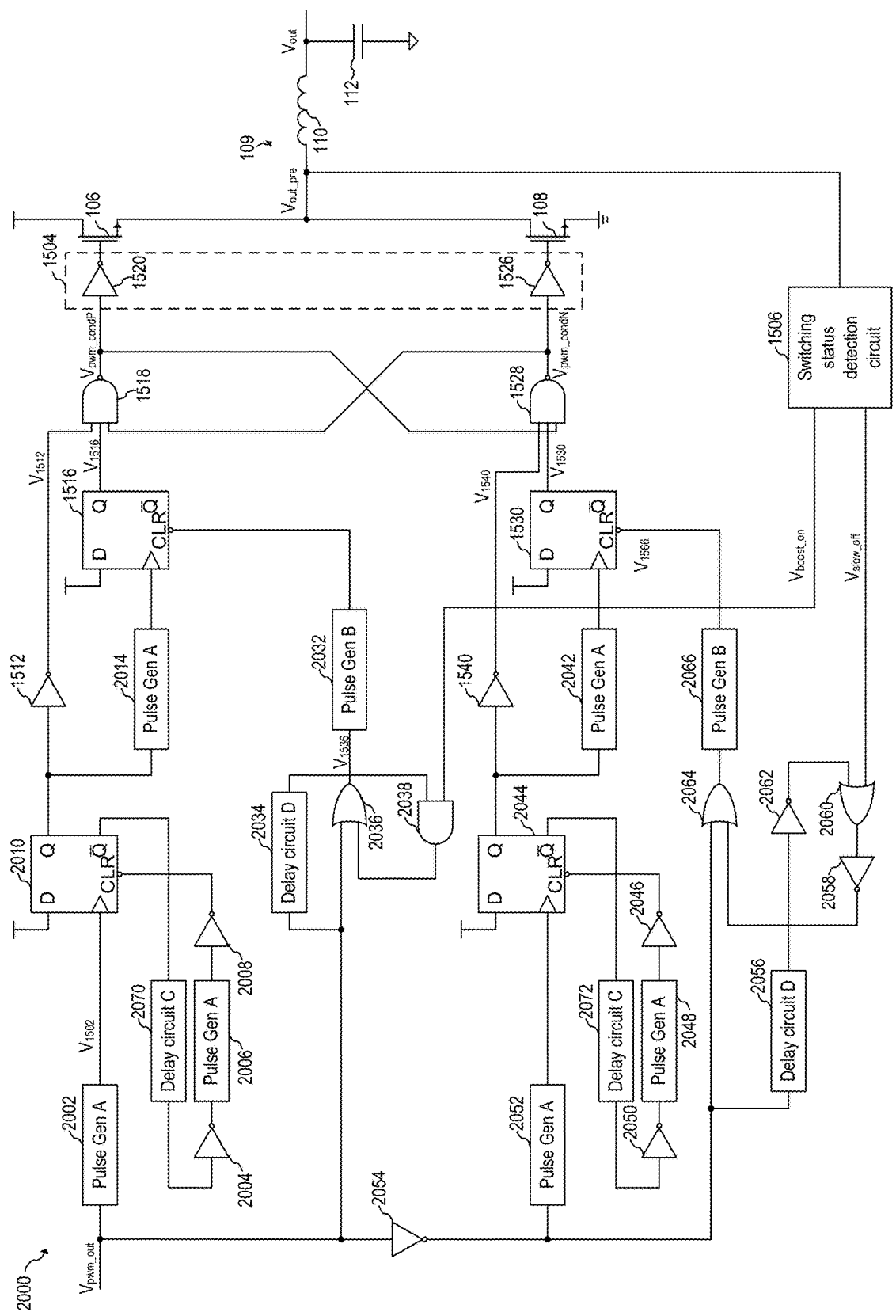
FIG. 20 shows the pre-conditioning controller of FIG. 15, according to an embodiment of the present invention.

FIG. 20 shows pre-conditioning controller 2000, according to an embodiment of the present invention. Pre-conditioning controller 2000 includes type A pulse generator circuits 2002, 2006, 2014, 2042, 2048, 2052, type B pulse generator circuits 2032 and 2066, type C delay circuits 2070 and 2072, type D delay circuit 2034 and 2056, D-flip-flops 1516, 1530, 2010 and 2044, AND gate 2038, OR gate 2036, 2060 and 2064, and inverters 1512, 1540, 2004, 2008, 2046, 2050, 2054, 2058, and 2062. In some embodiments, pre-conditioning controller 1502 may be implemented as pre-conditioning controller 2000.

During normal operation, D-flip-flop 1516 generates signal $V_{1516}$ based on $V_{pwm\_out}$ and $V_{boost\_on}$, D-flip-flop 2010 generates signal $V_{1512}$ (e.g., via inverter 1512) based on $V_{pwm\_out}$, D-flip-flop 1530 generates signal $V_{1530}$ based on $V_{pwm\_out}$ and $V_{slow\_off}$, and D-flip-flop 2044 generates signal $V_{1540}$ (e.g., via inverter 1540) based on $V_{pwm\_out}$. In some embodiments, delay circuits 2070 and 2072 are used to cause delay $t_{fix1}$ (and $t_{fix2}$), e.g., as illustrated in FIGS. 5-8.

In some embodiments, type D delay circuits 2034 and 2056 may be used as filtering logic, e.g., for preventing glitches in the latch that comprises NAND gates 1518 and 1528.

As shown in FIG. 20, in some embodiments, D-flip-flops 1516, 1530, 2010, and 2044 include a clear input to reset the flip-flop. In some embodiments, pulse generators 2002, 2006, 2014, 2042, 2048, 2052, 2032 and 2066 are used to set/reset flip-flops 2010, 1516, 2044, and 1530.

FIGS. 21A and 21B illustrate pulse generator circuit 2100 and associated waveforms, respectively, according to an embodiment of the present invention. In some embodiments, each of type A pulse generator circuits 2002, 2006, 2014, 2042, 2048, 2052 may be implemented as pulse generator circuit 2100.

FIGS. 22A and 22B illustrate pulse generator circuit 2200 and associated waveforms, respectively, according to an embodiment of the present invention. In some embodiments, each of type B pulse generator circuits 2032 and 2066 may be implemented as pulse generator circuit 2200. As shown in FIGS. 21A and 22A, in some embodiments, pulse generator circuits 2100 and 2200 may include identical delay circuits 2102 (e.g., implemented with a plurality of buffers, as shown in FIGS. 21A and 22A).

FIGS. 23A and 23B illustrate delay circuit 2300 and associated waveforms, respectively, according to an embodiment of the present invention. In some embodiments, each of type C delay circuits 2070 and 2072 may be implemented as pulse generator circuit 2300. In some embodiments, delay circuits 2070 and 2072 may be implemented, instead, with an RC circuit.

FIGS. 24A and 24B illustrate delay circuit 2400 and associated waveforms, respectively, according to an embodiment of the present invention. In some embodiments, type D delay circuits 2034 and 2056 may be implemented as delay circuit 2400.

Example embodiments of the present invention are summarized here. Other embodiments can also be understood from the entirety of the specification and the claims filed herein.

Example 1. A method for shaping a pulse-width modulation (PWM) signal, the method including: receiving an input PWM signal; generating an output PWM signal based on the input PWM signal by: when the input PWM signal transitions with a first edge of the input PWM signal, transitioning the output PWM signal with a first edge of the output PWM signal; and when the input PWM signal transitions with a second edge before the first edge of the output PWM signal transitions, delaying a second edge of the output PWM signal based on the first edge of the output PWM signal, where the second edge of the input PWM signal is a next edge of the input PWM signal after the first edge of the input PWM signal, and where the second edge of the output PWM signal is a next edge of the output PWM signal after the first edge of the output PWM signal.

Example 2. The method of example 1, where delaying the second edge of the output PWM signal including delaying the second edge of the output PWM signal by a preset time plus a driving delay, where the driving delay is based on a delay of a driving circuit driving the output PWM signal.

Example 3. The method of one of examples 1 or 2, where the driving circuit includes a high-side transistor and a low-side transistor coupled at a pre-filtering node, a high-side gate driver coupled to a control terminal of the high-side transistor, and a low-side gate driver coupled to a control terminal of the low-side transistor.

Example 4. The method of one of examples 1 to 3, further including: comparing the output PWM signal with a first threshold; comparing the output PWM signal with a second threshold different than the first threshold; and when the second edge of the input PWM signal occurs before the first edge of the output PWM signal crosses the first threshold, delaying transitioning high-side and low-side intermediate signals until the first edge of the output PWM signal crosses the second threshold, where generating the output PWM signal includes generating the output PWM signal with a high-side transistor driven based on the high-side intermediate signal, and a low-side transistor driven based on the low-side intermediate signal.

Example 5. The method of one of examples 1 to 4, where the first threshold is higher than the second threshold.

Example 6. The method of one of examples 1 to 5, where transitioning the high-side and low-side intermediate signals includes transitioning the high-side and low-side intermediate signals simultaneously.

Example 7. The method of one of examples 1 to 6, further including, when the input PWM signal transitions with the second edge after the first edge of the output PWM signal transitions, transitioning high-side and low-side intermediate signals based on the first edge of the output PWM signal, where generating the output PWM signal includes generating the output PWM signal with a high-side transistor driven based on the high-side intermediate signal, and a low-side transistor driven based on the low-side intermediate signal.

Example 8. The method of one of examples 1 to 7, further including: comparing the output PWM signal with a first threshold; comparing the output PWM signal with a second threshold different than the first threshold; and when the second edge of the input PWM signal occurs after the first edge of the output PWM signal crosses the first threshold, transitioning the high-side and low-side intermediate signals when the first edge of the output PWM signal crosses the second threshold.

Example 9. The method of one of examples 1 to 8, where transitioning the output PWM signal with the first edge includes transitioning the high-side and low-side intermediate signals with a preset delay therebetween, and where when the second edge of the input PWM signal occurs after the first edge of the output PWM signal crosses the first threshold, transitioning the high-side and low-side intermediate signals with a second delay time therebetween, the second delay time being smaller than the preset delay.

Example 10. The method of one of examples 1 to 9, where the first edge of the PWM input signal is a rising edge, the second edge of the PWM input signal is a falling edge, the first edge of the PWM output signal is a rising edge, and the second edge of the PWM output signal is a falling edge.

Example 11. A method for shaping a pulse-width modulation (PWM) signal, the method including: receiving an input PWM signal; generating an output PWM signal based on the input PWM signal with a high-side transistor driven based on a high-side intermediate signal, and a low-side transistor driven based on a low-side intermediate signal; when the input PWM signal transitions with a first edge of the input PWM signal, driving the high-side and low-side intermediate signals to cause transitioning the output PWM signal with a first edge of the output PWM signal; and when the input PWM signal transitions with a second edge after the first edge of the output PWM signal transitions, transitioning the high-side and low-side intermediate signals based on the first edge of the output PWM signal to cause a second edge of the output PWM signal, where the second edge of the input PWM signal is a next edge of the input PWM signal after the first edge of the input PWM signal, and where the second edge of the output PWM signal is a next edge of the output PWM signal after the first edge of the output PWM signal.

Example 12. The method of example ii, further including: when the input PWM signal transitions with the second edge before the first edge of the output PWM signal transitions, delaying transitioning the high-side and low-side intermediate signals to delay the second edge of the output PWM signal based on the first edge of the output PWM signal.

Example 13. A pulse-width modulation (PWM) pre-conditioning circuit including: a PWM input configured to receive an input PWM signal; high-side and low-side outputs configured to be coupled to control terminals of high-side and low-side transistors, respectively; a switching detection input configured to be coupled to the high-side and low-side transistors to monitor an output PWM signal; and a controller configured to: when the input PWM signal transitions with a first edge of the input PWM signal, drive the high-side and low-side outputs to cause a transition of the output PWM signal with a first edge of the output PWM signal, and when the input PWM signal transitions with a second edge before the first edge of the output PWM signal transitions, drive the high-side and low-side outputs to delay a second edge of the output PWM signal based on the first edge of the output PWM signal, where the second edge of the input PWM signal is a next edge of the input PWM signal after the first edge of the input PWM signal, and where the second edge of the output PWM signal is a next edge of the output PWM signal after the first edge of the output PWM signal.

Example 14. The PWM pre-conditioning circuit of example 13, further including a switching status detection circuit including: a first comparator having a first input coupled to the switching detection input and a second input configured to receive a first threshold; and a second comparator having a first input coupled to the switching detection input and a second input configured to receive a second threshold that is lower than the first threshold, where the controller is configured to determine whether the input PWM signal transitions with a second edge before the first edge of the output PWM signal transitions based on outputs of the first or second comparators, and where the controller is configured to drive the high-side and low-side outputs to delay the second edge of the output PWM signal based on outputs of the first or second comparators.

Example 15. The PWM pre-conditioning circuit of one of examples 13 or 14, further including: a first NAND gate having an output coupled to the high-side output, and a first input coupled to the controller; and a second NAND gate having an output coupled to the low-side output and to a second input of the first NAND gate, a first input coupled to the controller, and a second input coupled to the output of the first NAND gate.

Example 16. The PWM pre-conditioning circuit of one of examples 13 to 15, further including: a first flip-flop having an input coupled to the PWM input, and an output coupled to the first input of the first NAND gate; and a second flip-flop having a first input coupled to the output of the first flip-flop, a second input coupled to the switching detection input, and an output coupled to a third input of the first NAND gate.

Example 17. The PWM pre-conditioning circuit of one of examples 13 to 16, further including: a switching status detection circuit including: a first comparator having a first input coupled to the switching detection input and a second input configured to receive a first threshold, and a second comparator having a first input coupled to the switching detection input and a second input configured to receive a second threshold that is lower than the first threshold, where the second input of the second flip-flop is coupled to the switching detection input via the first comparator, the controller further including: a third flip-flop having an input coupled to the PWM input, and an output coupled to the second input of the second NAND gate; and a fourth flip-flop having a first input coupled to the output of the third flip-flop, a second input coupled to an output of the second comparator, and an output coupled to a third input of the second NAND gate.

Example 18. The PWM pre-conditioning circuit of one of examples 13 to 17, where the first, second, third, and fourth flip-flops are D-flip-flops, where the first input of the first flip-flop is a clock input, where the first input of the second flip-flop is a clock input and the second input of the second flip-flop is a clear input, where the first input of the third flip-flop is a clock input, and where the first input of the fourth flip-flop is a clock input and the second input of the fourth flip-flop is a clear input.

Example 19. A class-D amplifier including: an input terminal configured to receive an analog signal; an output terminal configured to be coupled to a load; an integrator circuit having a first input coupled to the input terminal and a second input coupled to the output terminal; a pulse-width modulation (PWM) modulator circuit having a first input coupled to an output of the integrator circuit, a second input configured to receive a clock signal, and an output configured to deliver a PWM signal; a pre-conditioning circuit having a first input coupled to the PWM modulator and a second input coupled to the output terminal; and an output stage having an input coupled to an output of the pre-conditioning circuit and an output coupled to the output terminal, the output stage configured to generate an output PWM signal at the output terminal based on the output of the pre-conditioning circuit, where the pre-conditioning circuit is configured to: when the PWM signal transitions with a first edge of the PWM signal, cause a transition of the output PWM signal with a first edge of the output PWM signal, and when the PWM signal transitions with a second edge before the first edge of the output PWM signal transitions, delay a second edge of the output PWM signal based on the first edge of the output PWM signal, where the second edge of the PWM signal is a next edge of the PWM signal after the first edge of the PWM signal, and where the second edge of the output PWM signal is a next edge of the output PWM signal after the first edge of the output PWM signal.

Example 20. The class-D amplifier of example 19, where the load is an audio speaker.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for shaping a pulse-width modulation (PWM) signal, the method comprising:
receiving an input PWM signal;
generating an output PWM signal based on the input PWM signal by:
when the input PWM signal transitions with a first edge of the input PWM signal, transitioning the output PWM signal with a first edge of the output PWM signal; and
when the input PWM signal transitions with a second edge before the first edge of the output PWM signal transitions, delaying a second edge of the output PWM signal based on the first edge of the output PWM signal, wherein the second edge of the input PWM signal is a next edge of the input PWM signal after the first edge of the input PWM signal, and wherein the second edge of the output PWM signal is a next edge of the output PWM signal after the first edge of the output PWM signal.

2. The method of claim 1, wherein delaying the second edge of the output PWM signal comprising delaying the second edge of the output PWM signal by a preset time plus a driving delay, wherein the driving delay is based on a delay of a driving circuit driving the output PWM signal.

3. The method of claim 2, wherein the driving circuit comprises a high-side transistor and a low-side transistor coupled at a pre-filtering node, a high-side gate driver coupled to a control terminal of the high-side transistor, and a low-side gate driver coupled to a control terminal of the low-side transistor.

4. The method of claim 1, further comprising:
comparing the output PWM signal with a first threshold;
comparing the output PWM signal with a second threshold different than the first threshold; and when the second edge of the input PWM signal occurs before the first edge of the output PWM signal crosses the first threshold, delaying transitioning high-side and low-side intermediate signals until the first edge of the output PWM signal crosses the second threshold, wherein generating the output PWM signal comprises generating the output PWM signal with a high-side transistor driven based on the high-side intermediate signal, and a low-side transistor driven based on the low-side intermediate signal.

5. The method of claim 4, wherein the first threshold is higher than the second threshold.

6. The method of claim 4, wherein transitioning the high-side and low-side intermediate signals comprises transitioning the high-side and low-side intermediate signals simultaneously.

7. The method of claim 1, further comprising, when the input PWM signal transitions with the second edge after the first edge of the output PWM signal transitions, transitioning high-side and low-side intermediate signals based on the first edge of the output PWM signal, wherein generating the output PWM signal comprises generating the output PWM signal with a high-side transistor driven based on the high-side intermediate signal, and a low-side transistor driven based on the low-side intermediate signal.

8. The method of claim 7, further comprising:
comparing the output PWM signal with a first threshold;
comparing the output PWM signal with a second threshold different than the first threshold; and
when the second edge of the input PWM signal occurs after the first edge of the output PWM signal crosses the first threshold, transitioning the high-side and low-side intermediate signals when the first edge of the output PWM signal crosses the second threshold.

9. The method of claim 8, wherein transitioning the output PWM signal with the first edge comprises transitioning the high-side and low-side intermediate signals with a preset delay therebetween, and wherein when the second edge of the input PWM signal occurs after the first edge of the output PWM signal crosses the first threshold, transitioning the high-side and low-side intermediate signals with a second delay time therebetween, the second delay time being smaller than the preset delay.

10. The method of claim 1, wherein the first edge of the PWM input signal is a rising edge, the second edge of the PWM input signal is a falling edge, the first edge of the PWM output signal is a rising edge, and the second edge of the PWM output signal is a falling edge.

11. A method for shaping a pulse-width modulation (PWM) signal, the method comprising:
receiving an input PWM signal;
generating an output PWM signal based on the input PWM signal with a high-side transistor driven based on a high-side intermediate signal, and a low-side transistor driven based on a low-side intermediate signal;
when the input PWM signal transitions with a first edge of the input PWM signal, driving the high-side and low-side intermediate signals to cause transitioning the output PWM signal with a first edge of the output PWM signal; and
when the input PWM signal transitions with a second edge after the first edge of the output PWM signal transitions, transitioning the high-side and low-side intermediate signals based on the first edge of the output PWM signal to cause a second edge of the output PWM signal, wherein the second edge of the input PWM signal is a next edge of the input PWM signal after the first edge of the input PWM signal, and wherein the second edge of the output PWM signal is a next edge of the output PWM signal after the first edge of the output PWM signal.

12. The method of claim 11, further comprising:
when the input PWM signal transitions with the second edge before the first edge of the output PWM signal transitions, delaying transitioning the high-side and low-side intermediate signals to delay the second edge of the output PWM signal based on the first edge of the output PWM signal.

13. A pulse-width modulation (PWM) pre-conditioning circuit comprising:
a PWM input configured to receive an input PWM signal;
high-side and low-side outputs configured to be coupled to control terminals of high-side and low-side transistors, respectively;
a switching detection input configured to be coupled to the high-side and low-side transistors to monitor an output PWM signal; and
a controller configured to:
when the input PWM signal transitions with a first edge of the input PWM signal, drive the high-side and low-side outputs to cause a transition of the output PWM signal with a first edge of the output PWM signal, and
when the input PWM signal transitions with a second edge before the first edge of the output PWM signal transitions, drive the high-side and low-side outputs to delay a second edge of the output PWM signal based on the first edge of the output PWM signal, wherein the second edge of the input PWM signal is a next edge of the input PWM signal after the first edge of the input PWM signal, and wherein the second edge of the output PWM signal is a next edge of the output PWM signal after the first edge of the output PWM signal.

14. The PWM pre-conditioning circuit of claim 13, further comprising a switching status detection circuit comprising:
a first comparator having a first input coupled to the switching detection input and a second input configured to receive a first threshold; and
a second comparator having a first input coupled to the switching detection input and a second input configured to receive a second threshold that is lower than the first threshold, wherein the controller is configured to determine whether the input PWM signal transitions with a second edge before the first edge of the output PWM signal transitions based on outputs of the first or second comparators, and wherein the controller is configured to drive the high-side and low-side outputs to delay the second edge of the output PWM signal based on outputs of the first or second comparators.

15. The PWM pre-conditioning circuit of claim 13, further comprising:
a first NAND gate having an output coupled to the high-side output, and a first input coupled to the controller; and
a second NAND gate having an output coupled to the low-side output and to a second input of the first NAND gate, a first input coupled to the controller, and a second input coupled to the output of the first NAND gate.

16. The PWM pre-conditioning circuit of claim 15, further comprising:
- a first flip-flop having an input coupled to the PWM input, and an output coupled to the first input of the first NAND gate; and
- a second flip-flop having a first input coupled to the output of the first flip-flop, a second input coupled to the switching detection input, and an output coupled to a third input of the first NAND gate.

17. The PWM pre-conditioning circuit of claim 16, further comprising:
- a switching status detection circuit comprising:
  - a first comparator having a first input coupled to the switching detection input and a second input configured to receive a first threshold, and
  - a second comparator having a first input coupled to the switching detection input and a second input configured to receive a second threshold that is lower than the first threshold, wherein the second input of the second flip-flop is coupled to the switching detection input via the first comparator, the controller further comprising:
    - a third flip-flop having an input coupled to the PWM input, and an output coupled to the second input of the second NAND gate; and
    - a fourth flip-flop having a first input coupled to the output of the third flip-flop, a second input coupled to an output of the second comparator, and an output coupled to a third input of the second NAND gate.

18. The PWM pre-conditioning circuit of claim 17, wherein the first, second, third, and fourth flip-flops are D-flip-flops, wherein the first input of the first flip-flop is a clock input, wherein the first input of the second flip-flop is a clock input and the second input of the second flip-flop is a clear input, wherein the first input of the third flip-flop is a clock input, and wherein the first input of the fourth flip-flop is a clock input and the second input of the fourth flip-flop is a clear input.

19. A class-D amplifier comprising:
- an input terminal configured to receive an analog signal;
- an output terminal configured to be coupled to a load;
- an integrator circuit having a first input coupled to the input terminal and a second input coupled to the output terminal;
- a pulse-width modulation (PWM) modulator circuit having a first input coupled to an output of the integrator circuit, a second input configured to receive a clock signal, and an output configured to deliver a PWM signal;
- a pre-conditioning circuit having a first input coupled to the PWM modulator and a second input coupled to the output terminal; and
- an output stage having an input coupled to an output of the pre-conditioning circuit and an output coupled to the output terminal, the output stage configured to generate an output PWM signal at the output terminal based on the output of the pre-conditioning circuit, wherein the pre-conditioning circuit is configured to:
  - when the PWM signal transitions with a first edge of the PWM signal, cause a transition of the output PWM signal with a first edge of the output PWM signal, and
  - when the PWM signal transitions with a second edge before the first edge of the output PWM signal transitions, delay a second edge of the output PWM signal based on the first edge of the output PWM signal, wherein the second edge of the PWM signal is a next edge of the PWM signal after the first edge of the PWM signal, and wherein the second edge of the output PWM signal is a next edge of the output PWM signal after the first edge of the output PWM signal.

20. The class-D amplifier of claim 19, wherein the load is an audio speaker.

* * * * *